United States Patent
Wang et al.

(10) Patent No.: US 11,770,327 B2
(45) Date of Patent: *Sep. 26, 2023

(54) DATA DISTRIBUTION METHOD, DATA AGGREGATION METHOD, AND RELATED APPARATUSES

(71) Applicant: HUAWEI TECHNOLOGIES CO., LTD., Guangdong (CN)

(72) Inventors: Xinyuan Wang, Beijing (CN); Wenbin Yang, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/714,515

(22) Filed: Dec. 13, 2019

(65) Prior Publication Data
US 2020/0120017 A1     Apr. 16, 2020

Related U.S. Application Data

(63) Continuation of application No. 15/141,686, filed on Apr. 28, 2016, now Pat. No. 10,547,539, which is a
(Continued)

(51) Int. Cl.
*H04L 12/00*     (2006.01)
*H04L 45/24*     (2022.01)
(Continued)

(52) U.S. Cl.
CPC ............ *H04L 45/245* (2013.01); *H03M 9/00* (2013.01); *H04L 1/0043* (2013.01);
(Continued)

(58) Field of Classification Search
CPC ...... H03M 9/00; H04L 1/0043; H04L 1/0052; H04L 1/0067; H04L 2001/0096;
(Continued)

(56) References Cited

U.S. PATENT DOCUMENTS 6,873,630 B1   3/2005   Muller et al.
7,054,321 B1   5/2006   Nanji
(Continued)

FOREIGN PATENT DOCUMENTS

CN     1620790 A     5/2005
CN     1748381 A     3/2006
(Continued)

OTHER PUBLICATIONS

Ori Gerstel et al.,"Elastic Optical Networking: A New Dawn for the Optical Layer?",IEEE Communications Magazine • Feb. 2012,total 9 pages.
(Continued)

*Primary Examiner* — Phuc H Tran
(74) *Attorney, Agent, or Firm* — James Anderson Harrison

(57) ABSTRACT

A data distribution method, a data aggregation method, and related apparatuses are disclosed. The data distribution method may include: receiving a first packet stream; dividing the first packet stream to obtain a first data block stream; sending the first data block stream to a first circuit; processing, by the first circuit, the first data block stream to obtain a first data stream; distributing, by the first circuit, the first data stream to N1 second circuits of M second circuits in a PT-W, where M is greater than N1, N1 is a positive integer, and M is a positive integer; and processing, by the N1 second circuits, the received first data stream to obtain N1 first code streams. The technical solutions provided by the embodiments of the present application help to meet a requirement for complex bandwidth configuration and extend an application scenario.

33 Claims, 18 Drawing Sheets

Related U.S. Application Data continuation of application No. PCT/CN2013/086783, filed on Nov. 8, 2013.

(51) Int. Cl.
| | |
|---|---|
| H04L 69/14 | (2022.01) |
| H04L 49/351 | (2022.01) |
| H03M 9/00 | (2006.01) |
| H04L 25/49 | (2006.01) |
| H04L 25/03 | (2006.01) |
| H04L 1/00 | (2006.01) |
| H04L 25/14 | (2006.01) |
| H04L 65/61 | (2022.01) |
| H04L 69/323 | (2022.01) |
| H04L 69/324 | (2022.01) |

(52) U.S. Cl.
CPC .......... *H04L 1/0052* (2013.01); *H04L 1/0067* (2013.01); *H04L 25/03866* (2013.01); *H04L 25/14* (2013.01); *H04L 25/4908* (2013.01); *H04L 49/352* (2013.01); *H04L 65/61* (2022.05); *H04L 69/14* (2013.01); *H04L 69/323* (2013.01); *H04L 69/324* (2013.01); H04L 2001/0096 (2013.01)

(58) Field of Classification Search
CPC .............. H04L 25/03866; H04L 25/14; H04L 25/4908; H04L 45/245; H04L 49/352; H04L 65/4069; H04L 69/14; H04L 69/323; H04L 69/324; H04L 12/00; H04L 12/2856; H04L 12/6418; H04L 1/0002; H04L 1/0026; H04L 25/03872; H04L 12/2801; H04L 12/2861; H04L 12/2872; H04L 12/2898; H04L 12/40169; H04L 12/40182; H04L 12/66

See application file for complete search history.

(56) References Cited

U.S. PATENT DOCUMENTS

| | | | | |
|---|---|---|---|---|
| 7,096,484 | B2* | 8/2006 | Mao | H04N 21/4782 |
| | | | | 725/52 |
| 7,869,468 | B1* | 1/2011 | Giannakopoulos | |
| | | | | H04L 12/4633 |
| | | | | 370/537 |
| 8,204,074 | B2 | 6/2012 | Pantelias | |
| 8,363,649 | B2* | 1/2013 | Konda | H04L 49/201 |
| | | | | 370/413 |
| 8,385,374 | B1 | 2/2013 | Wohlgemuth | |
| 8,547,987 | B2* | 10/2013 | Oh | H04N 21/4345 |
| | | | | 370/432 |
| 8,732,375 | B1 | 5/2014 | Vijayaraghavan et al. | |
| 8,824,501 | B2* | 9/2014 | Liu | H04B 10/61 |
| | | | | 370/464 |
| 8,984,380 | B2* | 3/2015 | Vijayaraghavan | H03M 13/353 |
| | | | | 714/776 |
| 9,048,889 | B1 | 6/2015 | Vijayaraghavan et al. | |
| 9,503,092 | B2* | 11/2016 | Wang | H03K 19/1776 |
| 9,817,933 | B2* | 11/2017 | Wang | H03K 19/17744 |
| 9,942,064 | B2* | 4/2018 | Li | H04L 25/03872 |
| 2004/0100958 | A1* | 5/2004 | Peng | H04L 49/25 |
| | | | | 370/392 |
| 2004/0156390 | A1 | 8/2004 | Prasad et al. | |
| 2006/0248563 | A1* | 11/2006 | Lee | H04H 60/07 |
| | | | | 725/117 |
| 2007/0234172 | A1 | 10/2007 | Chiabrera | |
| 2009/0154492 | A1* | 6/2009 | Diab | H04L 47/10 |
| | | | | 370/465 |
| 2009/0274172 | A1 | 11/2009 | Shen et al. | |
| 2012/0027026 | A1* | 2/2012 | Duwel | H04L 5/22 |
| | | | | 370/465 |
| 2012/0087436 | A1* | 4/2012 | Srinivasa | H04L 1/0059 |
| | | | | 375/295 |
| 2012/0099427 | A1* | 4/2012 | Huang | H04L 45/28 |
| | | | | 370/242 |
| 2012/0155486 | A1* | 6/2012 | Ahn | H04L 5/1423 |
| | | | | 370/433 |
| 2013/0077623 | A1* | 3/2013 | Han | H04L 47/25 |
| | | | | 370/389 |
| 2013/0283085 | A1 | 10/2013 | Venkatraman | |
| 2014/0044137 | A1 | 2/2014 | Miyaji et al. | |
| 2014/0120861 | A1* | 5/2014 | Kwak | H04W 4/90 |
| | | | | 455/404.1 |
| 2015/0003477 | A1* | 1/2015 | Baeckler | H04L 25/14 |
| | | | | 370/503 |
| 2016/0191277 | A1 | 6/2016 | Li et al. | |

FOREIGN PATENT DOCUMENTS

| | | |
|---|---|---|
| CN | 101309258 A | 11/2008 |
| CN | 101399811 A | 4/2009 |
| CN | 101631064 A | 1/2010 |
| CN | 101997645 A | 3/2011 |
| CN | 102148761 A | 8/2011 |
| CN | 102474353 A | 5/2012 |
| CN | 203135910 U | 8/2013 |
| EP | 1471705 A1 | 10/2004 |
| EP | 3043497 A1 | 7/2016 |

OTHER PUBLICATIONS

IEEE P802.3ba™/D3.2 "Part 3: Carrier Sense Multiple Access withCollision Detection (CSMA/CD) Access Method and Physical Layer Specifications-Amendment: Media Access Control Parameters, Physical Layers and ManagementParameters for 40 GB/s and 100 GB/s Operation", Mar. 24, 2010,total 461 pages.

XP11198464,Gary Nicholl et al:"A physical coding sublayer for 100GbE", IEEE ApplicationsandPractice Dec. 2007,total 8 pages.

XP11305453, Toyoda H et al:"100GbE PHY and MAC layer implementations". Mar. 1, 2010,IEEE Communications Magazine,total 8 pages.

XP11387939, Reviriego P et al:"lmproving energy efficiency in IEEE 802.3ba high-rate ethernet optical links",IEEE Journal of Selected Topics in Quantum Electronics (vol. 17 , Issue: 2 , Mar.-Apr. 2011 ),total 10 pages.

XP31908504, Masashi Kono et al:"A 400-Gb/s and low-power physical-layer architecture for next-generation ethernet", Jun. 5, 2011,2011 IEEE International Conference on Communications (ICC),total 6 pages.

\* cited by examiner

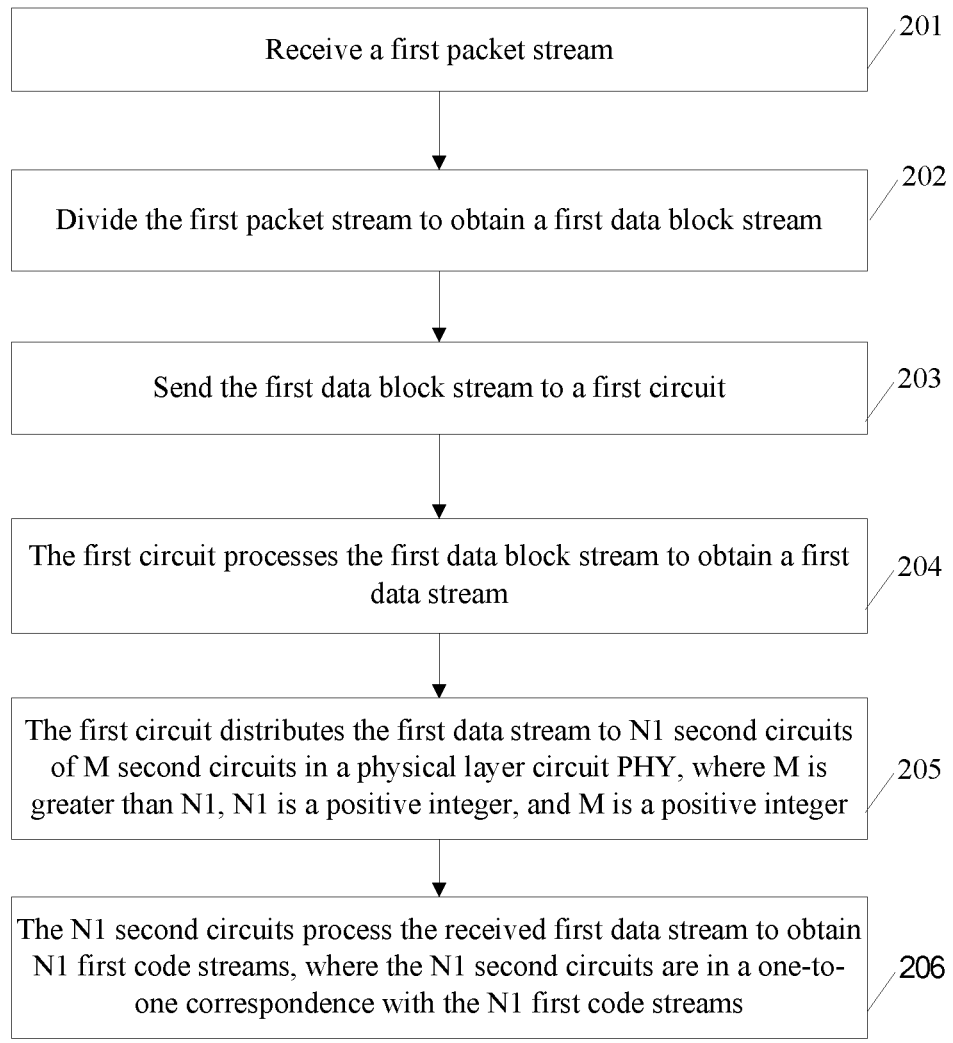
FIG. 2-a

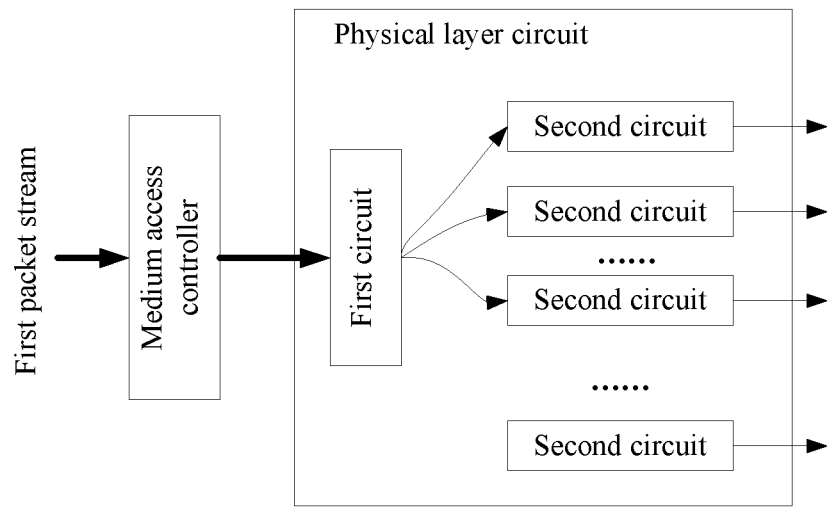
FIG. 2-b
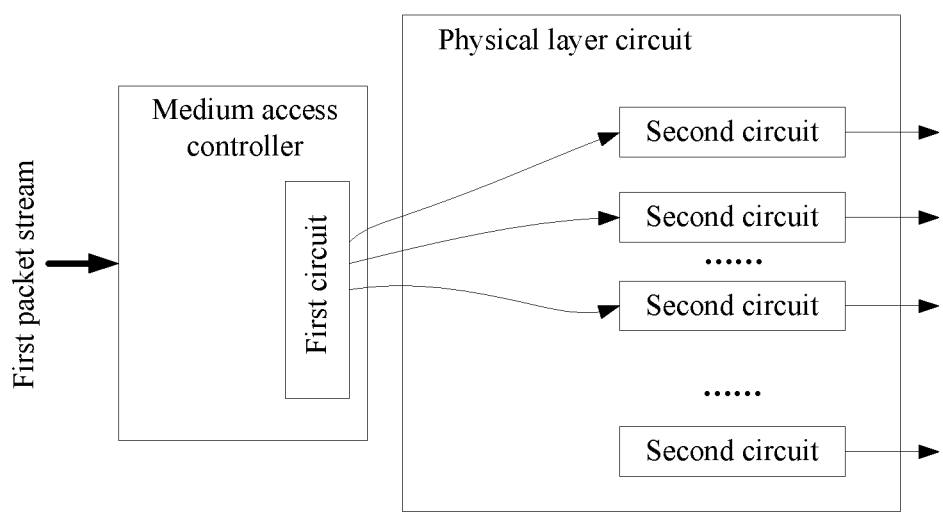
FIG. 2-c

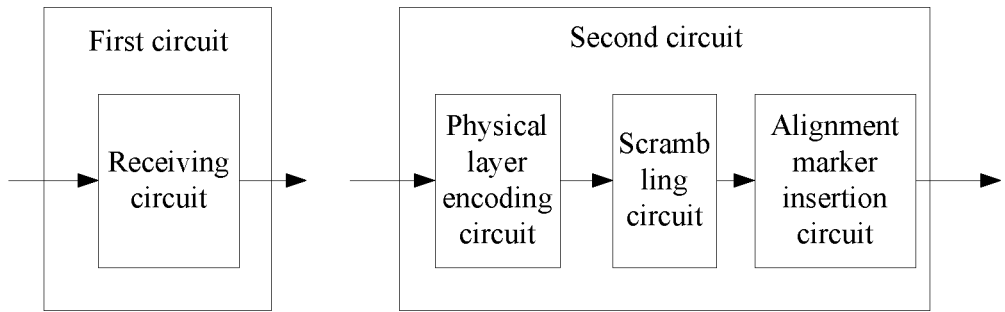
FIG. 2-d
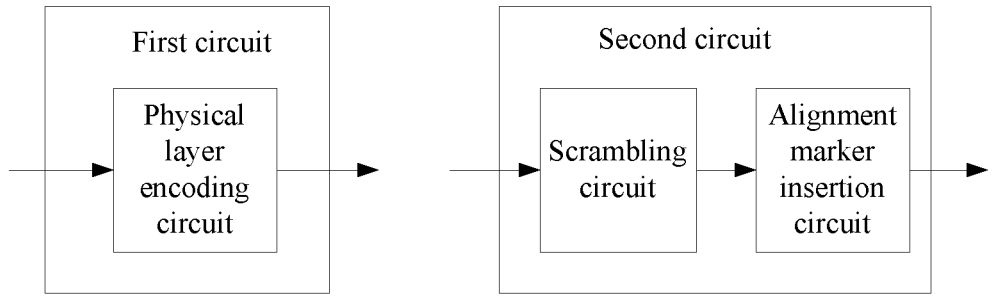
FIG. 2-e
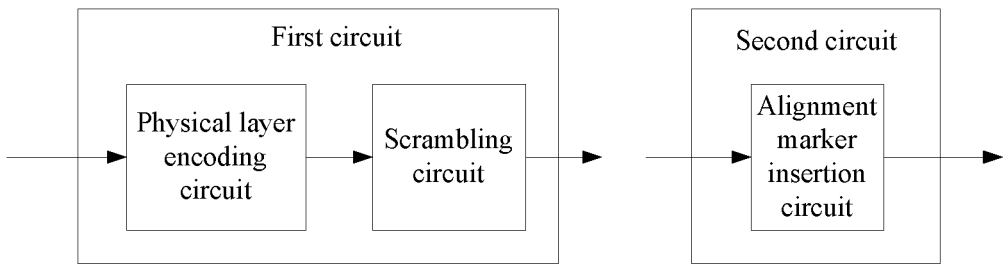
FIG. 2-f

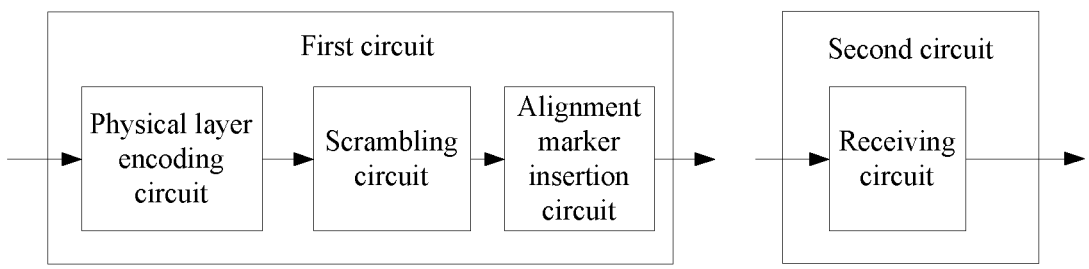
FIG. 2-g
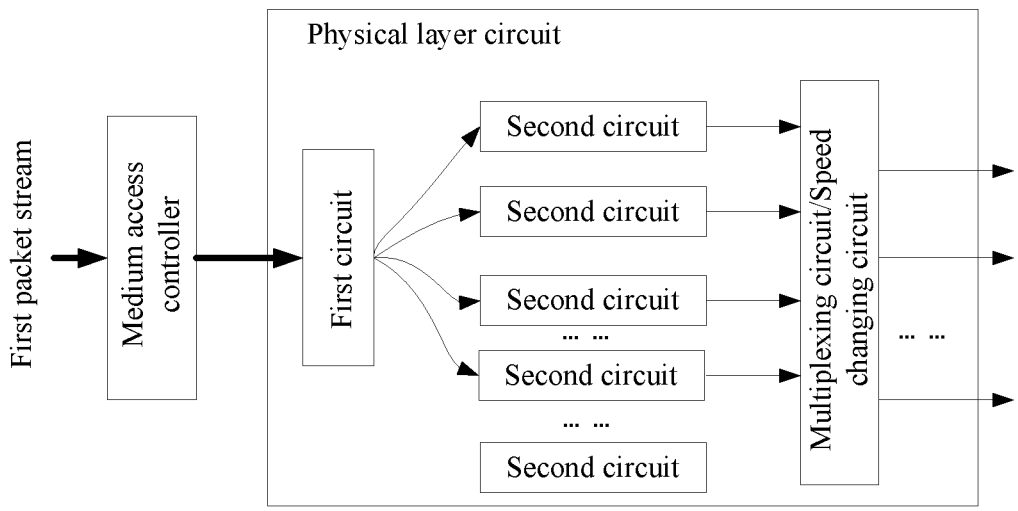
FIG. 2-h

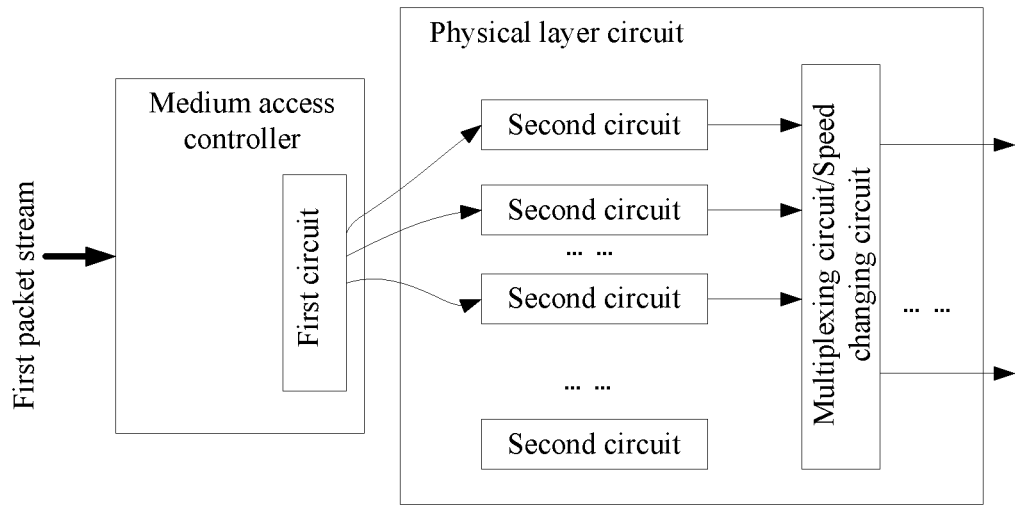
FIG. 2-i
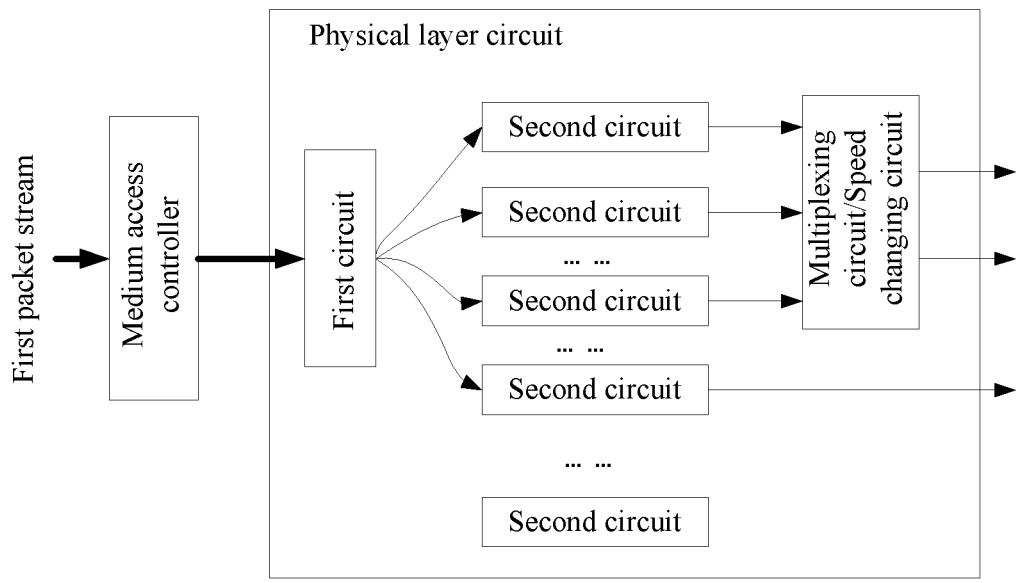
FIG. 2-j

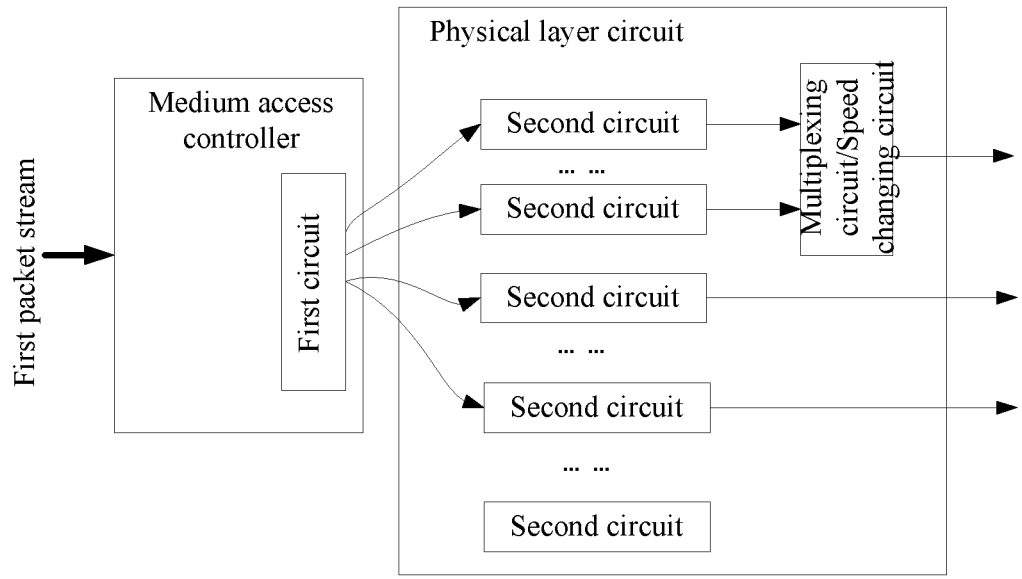
FIG. 2-k
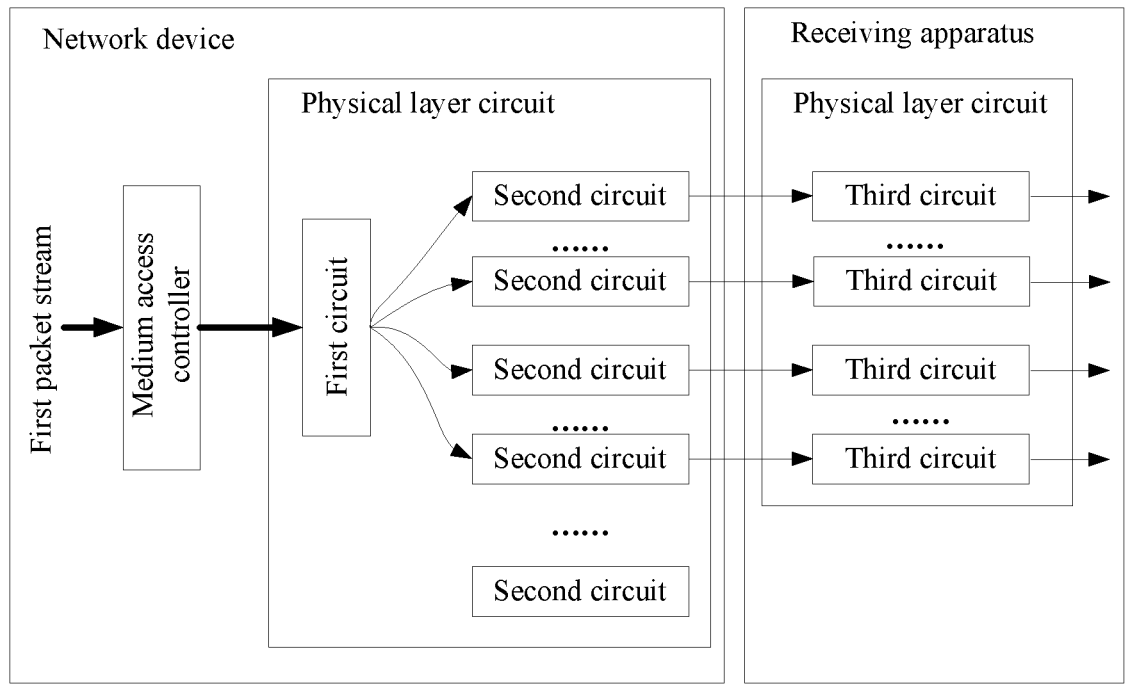
FIG. 2-l

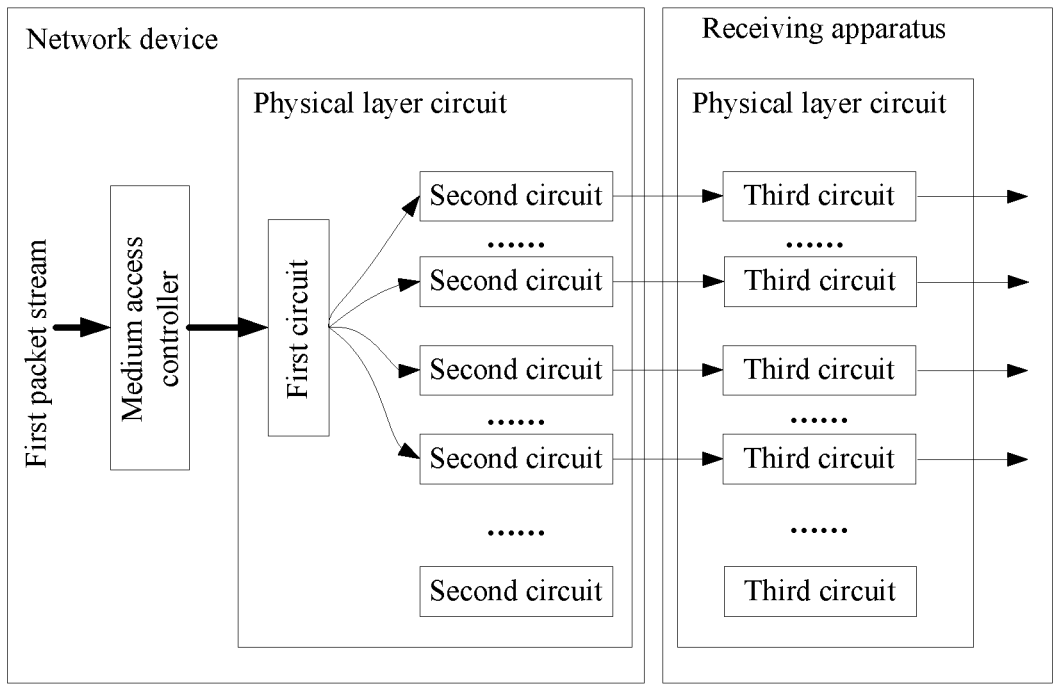
FIG. 2-m
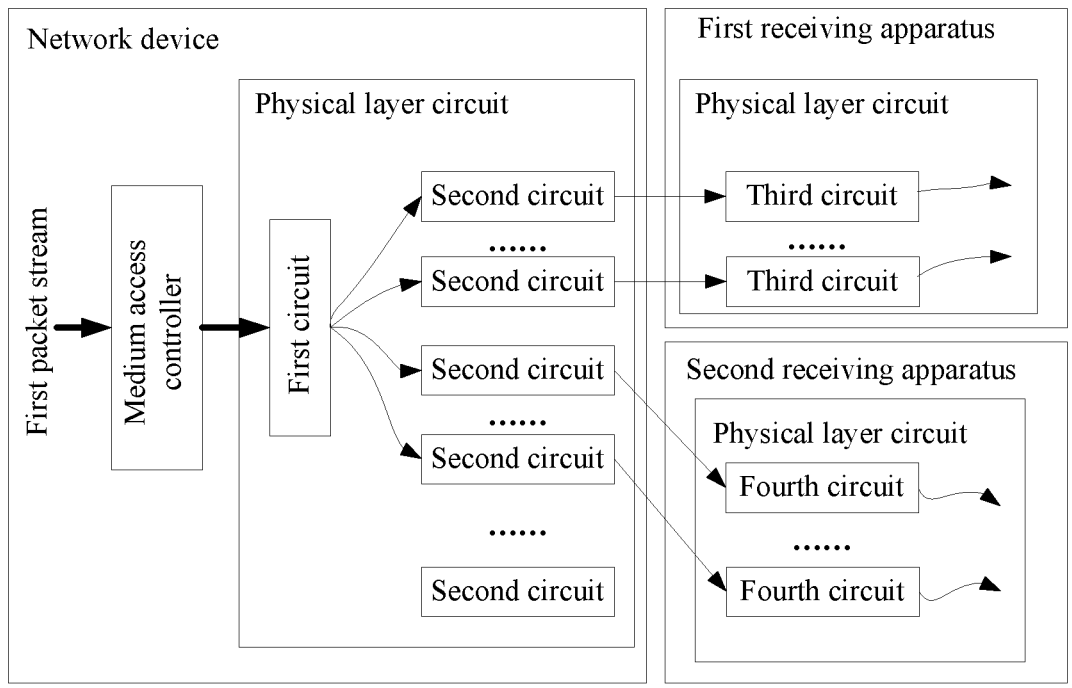
FIG. 2-n

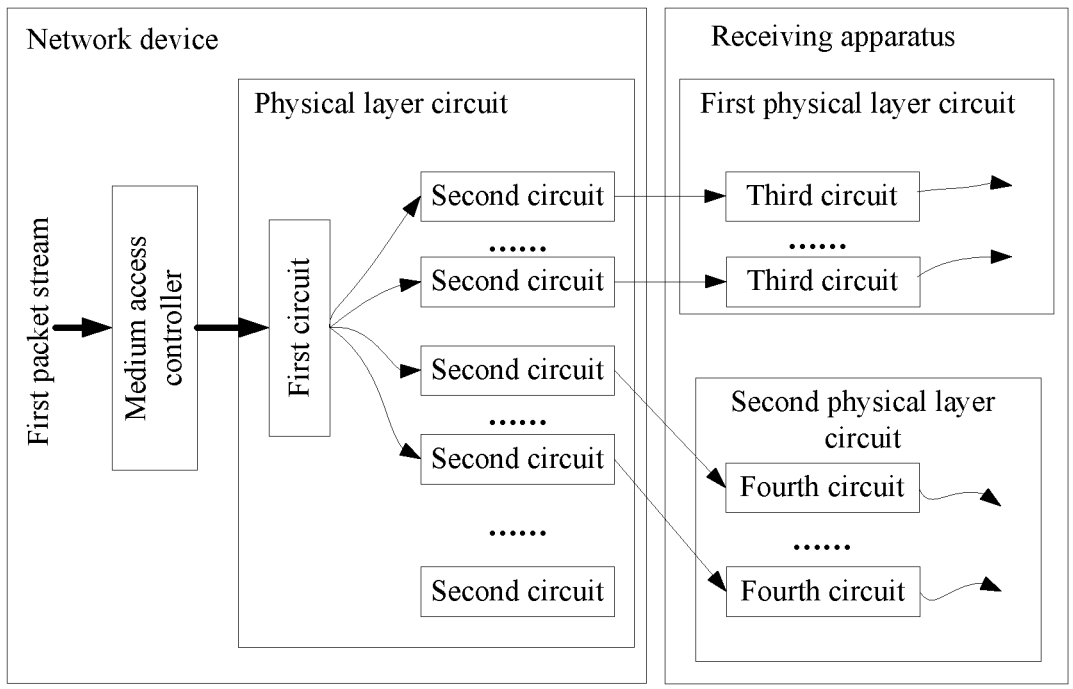
FIG. 2-o
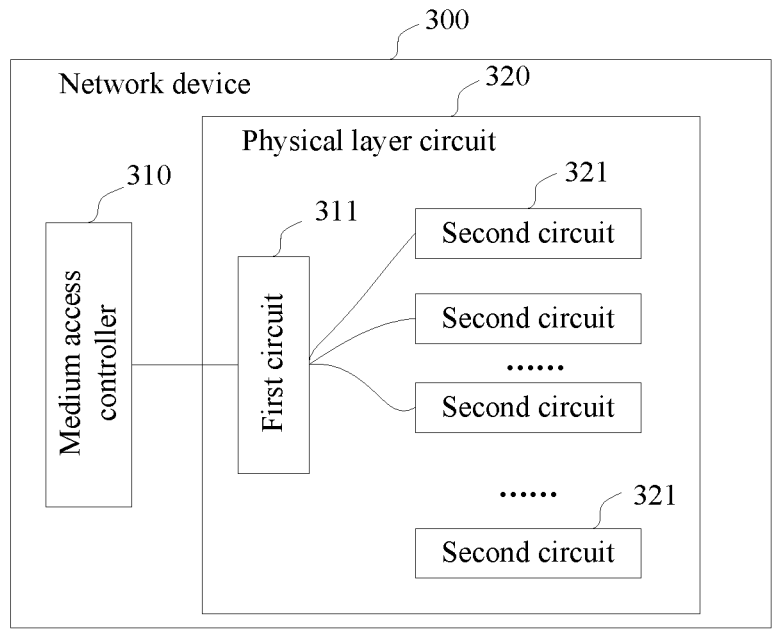
FIG. 3-a

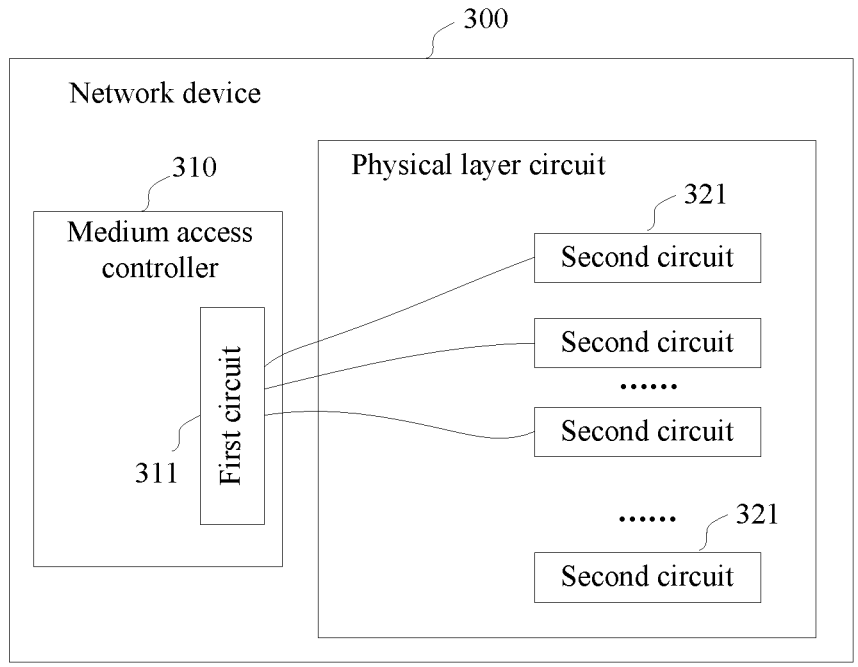
FIG. 3-b
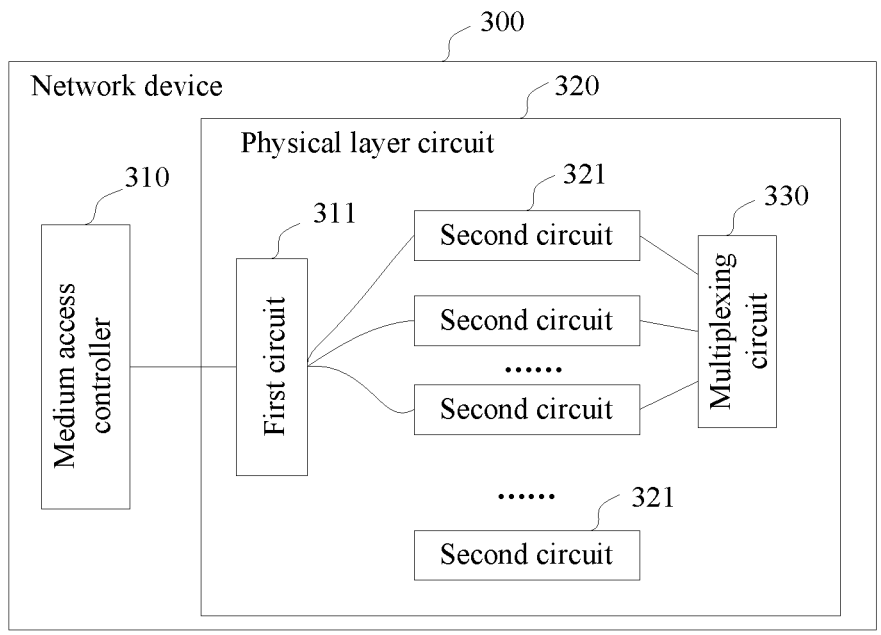
FIG. 3-c

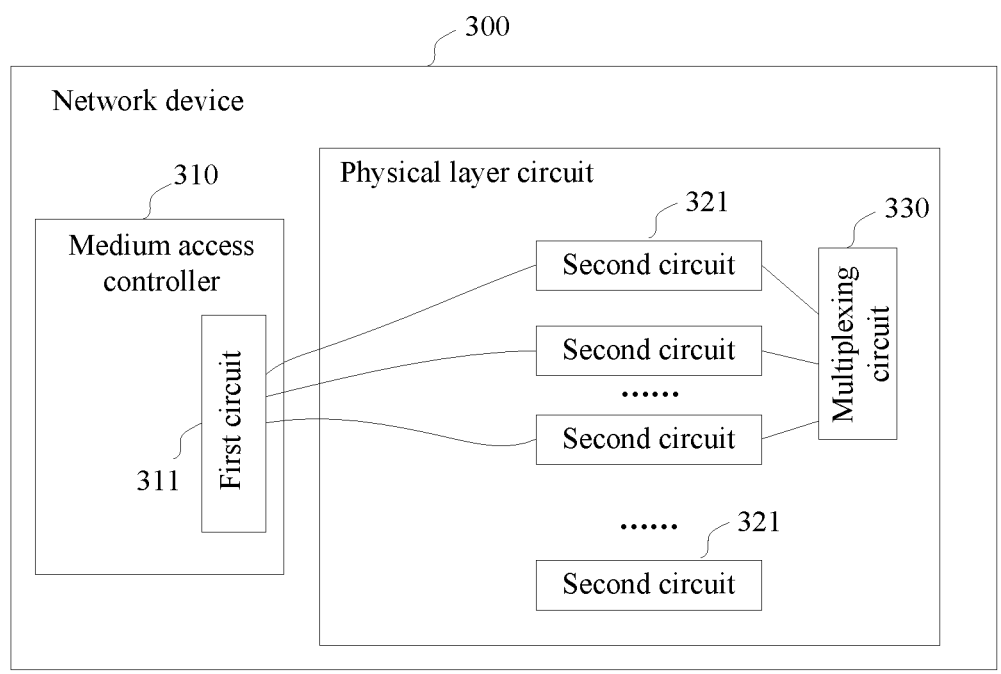
FIG. 3-d

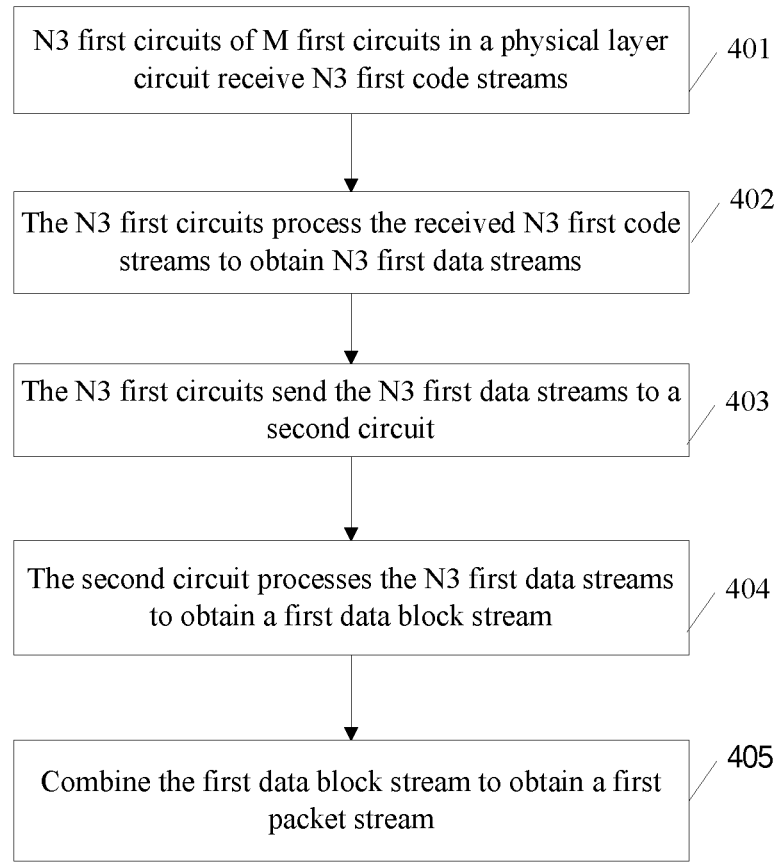
FIG. 4-a
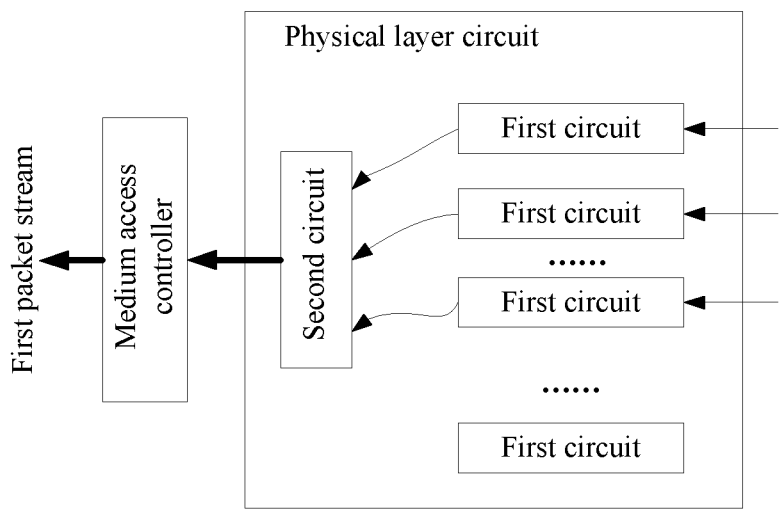
FIG. 4-b

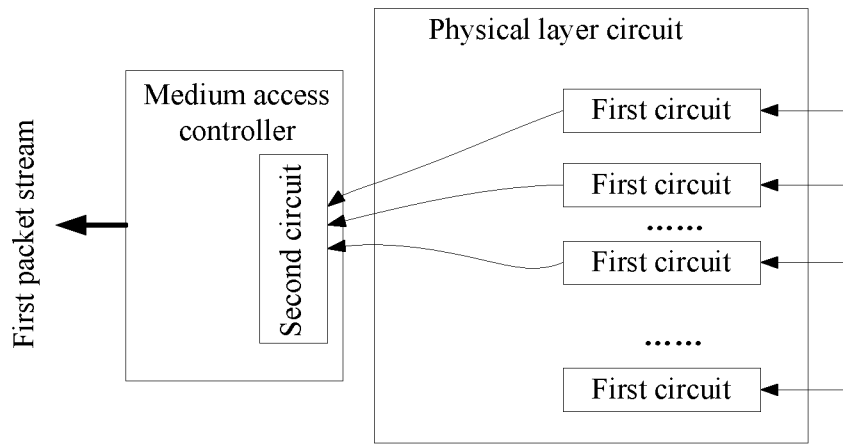
FIG. 4-c
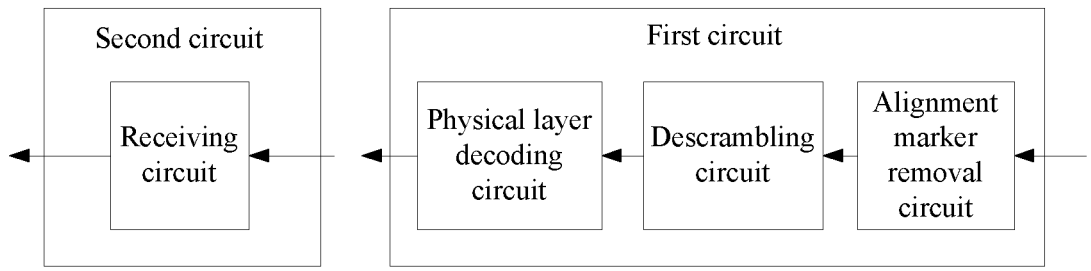
FIG. 4-d
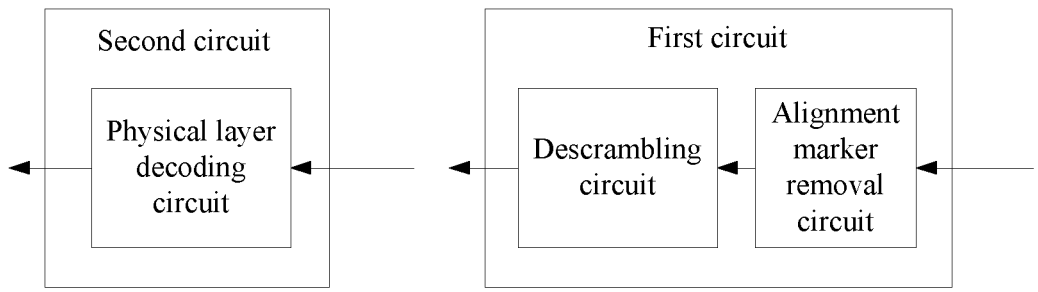
FIG. 4-e

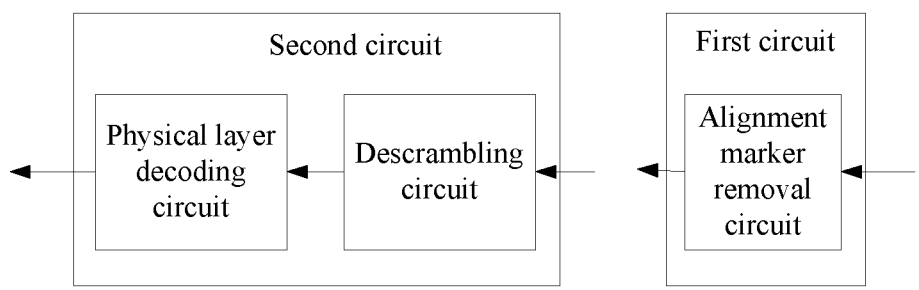
FIG. 4-f
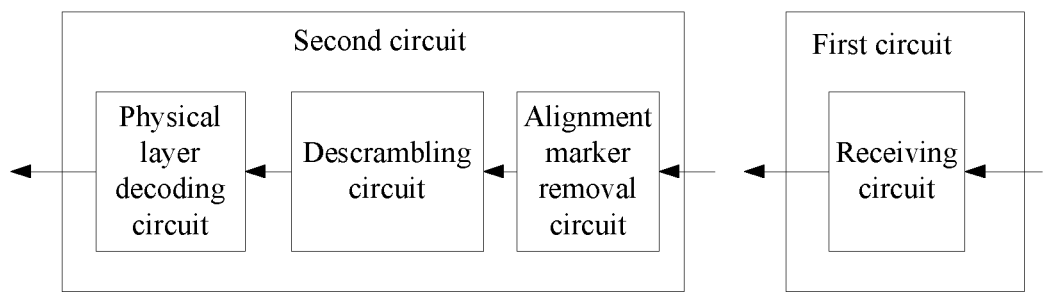
FIG. 4-g

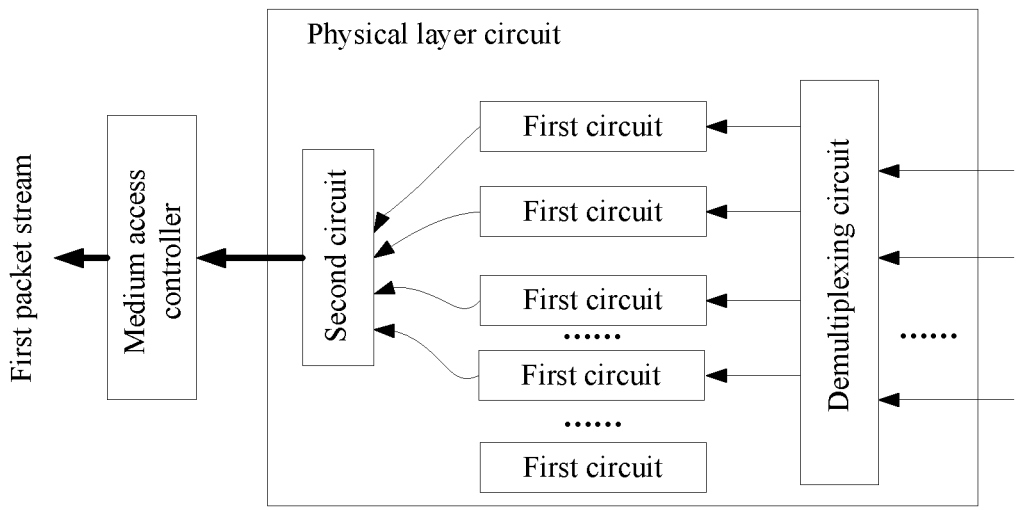
FIG. 4-h
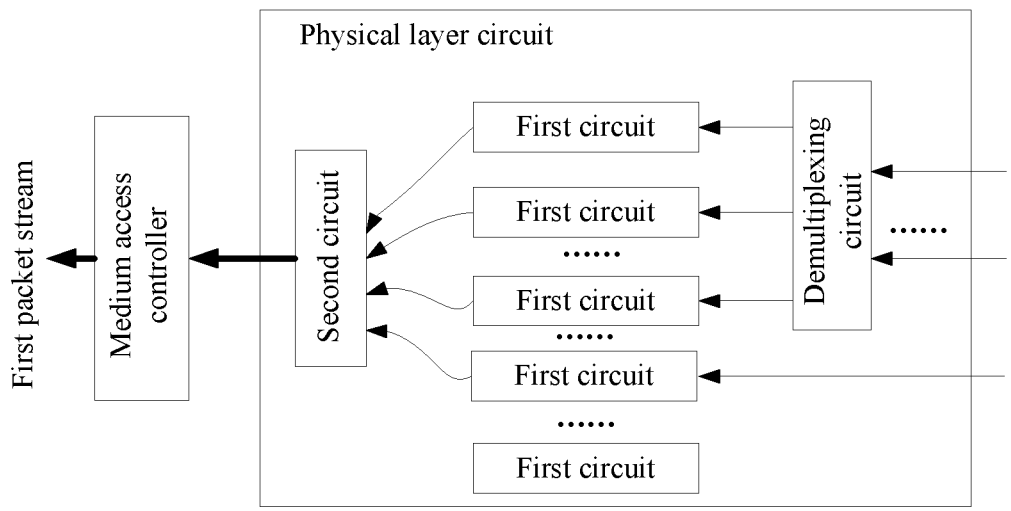
FIG. 4-i

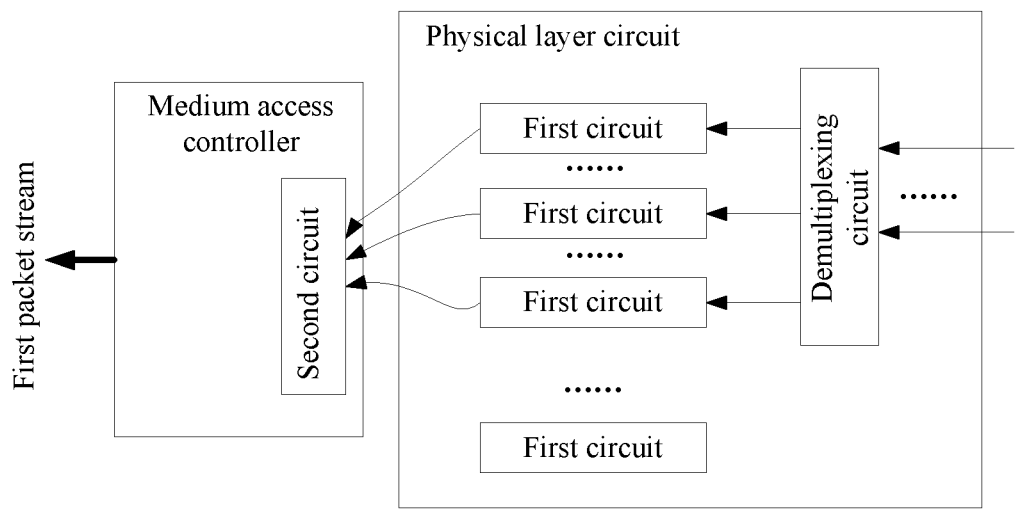
FIG. 4-j
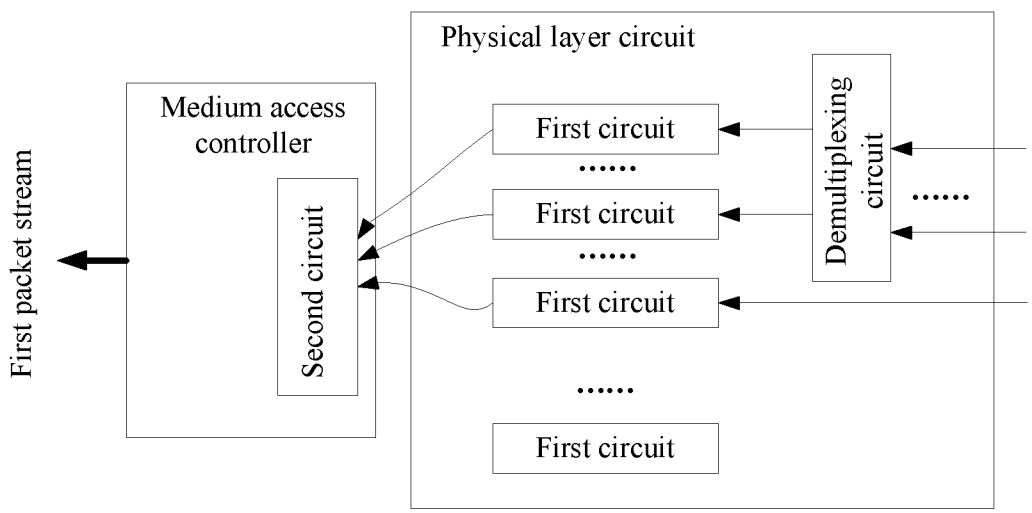
FIG. 4-k

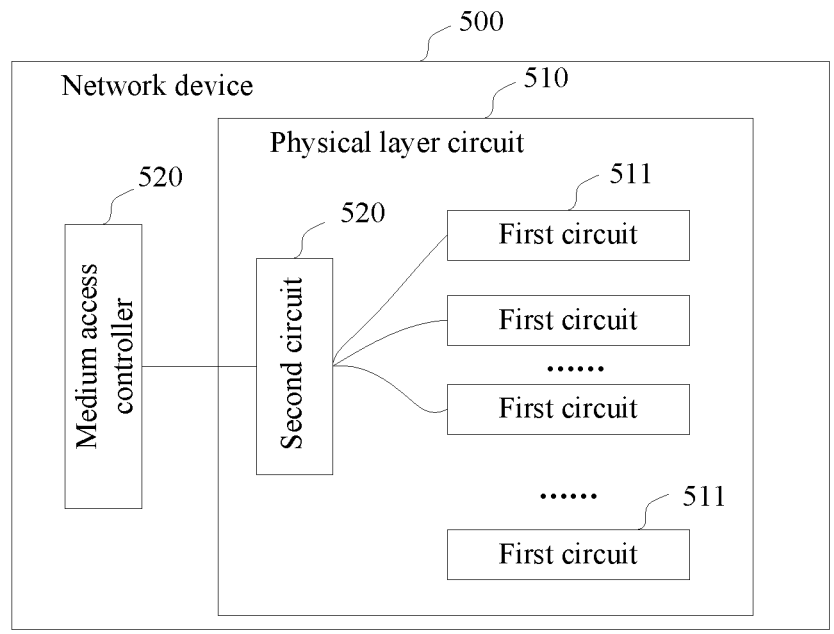
FIG. 5-a
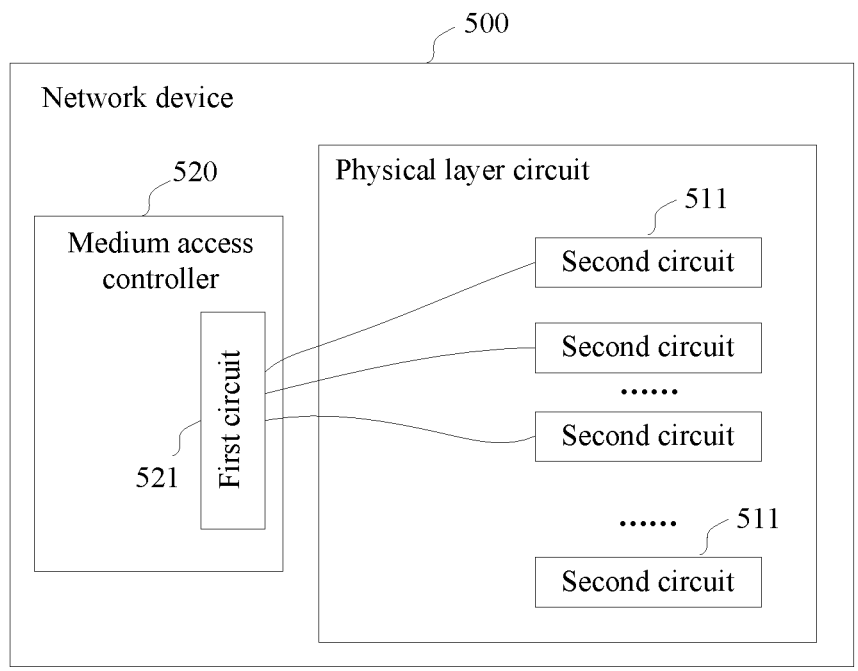
FIG. 5-b

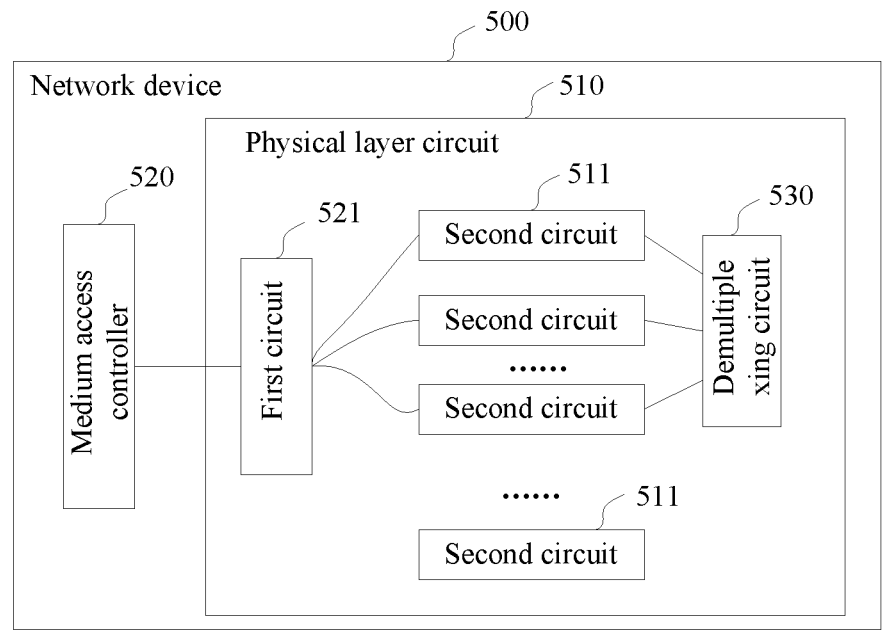
FIG. 5-c
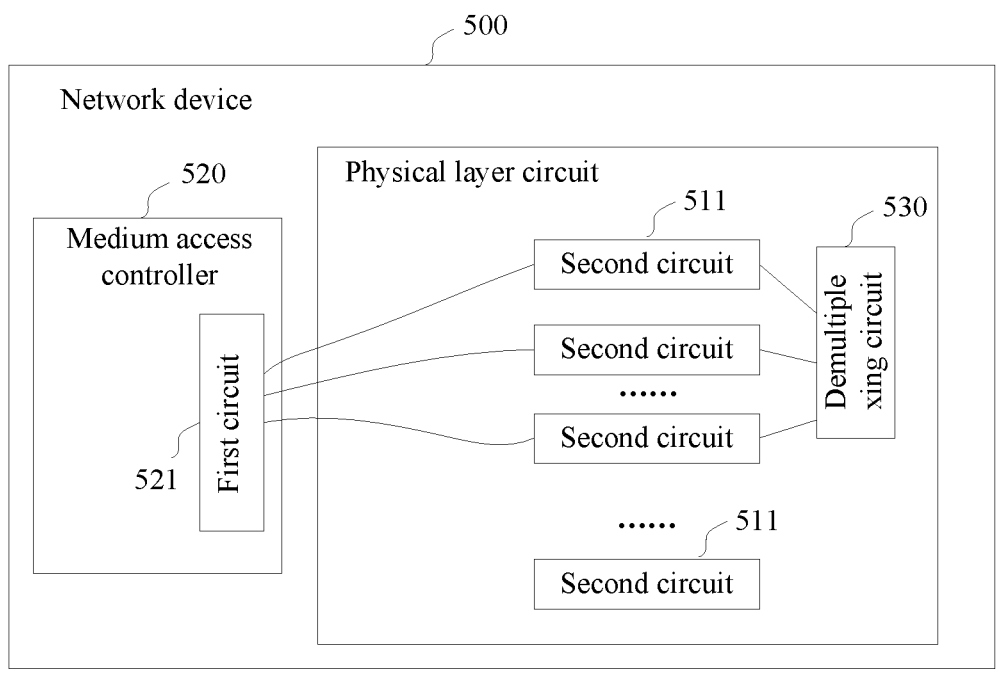
FIG. 5-d

DATA DISTRIBUTION METHOD, DATA AGGREGATION METHOD, AND RELATED APPARATUSES

CROSS-REFERENCE TO RELATED APPLICATIONS

This application is a continuation of U.S. patent application Ser. No. 15/141,686, filed on Apr. 28, 2016, which is a continuation of International Application No. PCT/CN2013/086783, filed on Nov. 8, 2013. Both of the aforementioned applications are hereby incorporated by reference in their entireties.

TECHNICAL FIELD

The present application relates to the field of communications technologies, and in particular, to a data aggregation (aggregate) method, a data distribution method, and related apparatuses.

BACKGROUND

Currently, traffic of a telecom backbone network is growing rapidly by 50% to 80% each year. Since early 2011, the 802.3 working group of the Institute of Electrical and Electronics Engineers (institute of electrical and electronics engineers, IEEE) started to collect bandwidth development demands after a 100 gigabit Ethernet (gigabit ethernet, GE for short) standard was published. It is estimated that network traffic in 2015 may be 10 times as much as that in 2010. In the future, there may be two types of Ethernet interfaces: 400 GE and 1 terabit Ethernet (terabit Ethernet, TE for short). The foregoing two types of Ethernet interfaces may be widely applied in 2015 and 2020.

A rate of an existing router is generally 200 G, 480 G, or 1 Tbps. However, on a physical subboard, Ethernet interfaces of different rates are generally implemented by using different hardware designs. An existing problem is that there are many types of physical subboards and different Ethernet interface chips need to be designed for different types of subboards, which consequently causes problems of a heavy workload and an increased cost resulting from many types of chips. A network device supplier needs to prepare multiples types of boards, which may multiply an investment.

In the prior art, a 100 GE interface is implemented according to the IEEE 802.3ba standard; and by using a single port or the Internet Protocol (internet protocol, IP for short), a Media Access Control (media access control) protocol layer interface in the prior art is generally implemented by binding multiple ports to obtain a trunk (trunk) interface. The router is externally presented as a fixed-rate Media Access Control protocol layer interface. To vividly describe a structure of an existing Medium Access Control protocol layer interface implemented by using a single port, the existing fixed-rate single-port Medium Access Control protocol layer interface may be represented in a form of a channel (channel), as shown in FIG. 1. FIG. 1 is a schematic diagram of a Medium Access Control protocol layer interface that is of an existing router and is implemented by using a single port in the prior art. The interface is a large channel from top to bottom, and the channel may process a data stream of a fixed-rate Medium Access Control protocol layer. In addition, interconnection and interworking with a peer device can be implemented only by using the fixed-rate Medium Access Control protocol layer interface.

An existing fixed-rate single-port Ethernet interface can hardly meet a requirement for complex bandwidth configuration, and has a limited application scenario.

SUMMARY

Embodiments of the present application provide a data distribution method, a data aggregation method, and related apparatuses, to meet a requirement for complex bandwidth configuration and extend an application scenario.

A first aspect of the present application provides a data distribution method, including:
receiving a first packet stream;
dividing the first packet stream to obtain a first data block stream;
sending the first data block stream to a first circuit;
processing, by the first circuit, the first data block stream to obtain a first data stream;
distributing, by the first circuit, the first data stream to N1 second circuits of M second circuits in a physical layer circuit PHY, where the M is greater than the N1, the N1 is a positive integer, and the M is a positive integer; and
processing, by the N1 second circuits, the received first data stream to obtain N1 first code streams, wherein the N1 second circuits are in a one-to-one correspondence with the N1 first code streams;
where:
the first circuit includes a receiving circuit, the first data stream is the first data block stream, and each second circuit of the M second circuits includes a physical layer encoding circuit, a scrambling circuit, and an alignment marker insertion circuit;
or,
the first circuit includes a physical layer encoding circuit, the first data stream is a data stream that is obtained after physical layer encoding is performed on the first data block stream, each second circuit of the M second circuits includes a scrambling circuit and an alignment marker insertion circuit, and the first circuit is a circuit in the PHY;
or,
the first circuit includes a physical layer encoding circuit and a scrambling circuit, the first data stream is a data stream that is obtained after physical layer encoding and scrambling are performed on the first data block stream, each second circuit of the M second circuits includes an alignment marker insertion circuit, and the first circuit is a circuit in the PHY;
or,
the first circuit includes a physical layer encoding circuit, a scrambling circuit, and an alignment marker insertion circuit, the first data stream is a data stream that is obtained after physical layer encoding, scrambling, and alignment marker insertion are performed on the first data block stream, each second circuit of the M second circuits includes a receiving circuit, and the first circuit is a circuit in the PHY.

With reference to the first aspect, in a first possible implementation manner,
the method further includes:
disabling, in the M second circuits, at least one second circuit except the N1 second circuits.

With reference to the first aspect or the first possible implementation manner of the first aspect, in a second possible implementation manner, a maximum processing rate that can be provided by the N1 second circuits is greater than or equal to a rate of the first data block stream.

With reference to the first aspect, the first possible implementation manner of the first aspect, or the second possible implementation manner of the first aspect, in a third possible implementation manner, after the processing, by the N1 second circuits, the first data stream to obtain N1 first code streams, the method further includes:

sending, by the N1 second circuits, the N1 first code streams to a multiplexing circuit; and performing, by the multiplexing circuit, multiplexing processing on the N1 first code streams to obtain X second code streams, where the X is a positive integer less than or equal to the N1.

With reference to the first aspect, the second possible implementation manner of the first aspect, or the third possible implementation manner of the first aspect, in a fourth possible implementation manner, the method further includes:

receiving a second packet stream;

dividing the second packet stream into a second data block stream;

sending the second data block stream to the first circuit;

processing, by the first circuit, the second data block stream to obtain a second data stream;

distributing, by the first circuit, the second data stream to N2 second circuits of the M second circuits in the PHY, where the M is greater than the N2, the N2 is a positive integer, and an intersection between the N2 second circuits and the N1 second circuits is an empty set; and processing, by the N2 second circuits, the received second data stream to obtain N2 third code streams, where the N2 second circuits are in a one-to-one correspondence with the N2 third code streams;

where:

the second data stream is the second data block stream; or the second data stream is a data stream that is obtained after physical layer encoding is performed on the second data block stream; or the second data stream is a data stream that is obtained after physical layer encoding and scrambling are performed on the second data block stream; or the second data stream is a data stream that is obtained after physical layer encoding, scrambling, and alignment marker insertion are performed on the second data block stream.

With reference to the first aspect or any one of the foregoing possible implementation manners of the first aspect, in a fifth possible implementation manner of the first aspect, the method further includes:

sending, by the N1 second circuits, the N1 first code streams to a PHY of a receiving apparatus, where the PHY of the receiving apparatus includes only N1 third circuits, and the N1 first code streams are in a one-to-one correspondence with the N1 third circuits, where:

each third circuit includes an alignment marker removal circuit, a descrambling circuit, and a physical layer decoding circuit; or each third circuit includes an alignment marker removal circuit and a descrambling circuit; or each third circuit includes an alignment marker removal circuit; or each third circuit includes a receiving circuit.

With reference to the first aspect or any one of the foregoing possible implementation manners of the first aspect, in a sixth possible implementation manner of the first aspect, the method further includes:

sending, by the N1 second circuits, the N1 first code streams to a PHY of a receiving apparatus, where the PHY of the receiving apparatus includes M third circuits, and the N1 first code streams are in a one-to-one correspondence with N1 third circuits of the M third circuits, where:

each third circuit includes an alignment marker removal circuit, a descrambling circuit, and a physical layer decoding circuit; or each third circuit includes an alignment marker removal circuit and a descrambling circuit; or each third circuit includes an alignment marker removal circuit; or each third circuit includes a receiving circuit.

With reference to the first aspect or any one of the foregoing possible implementation manners of the first aspect, in a seventh possible implementation manner of the first aspect, the method further includes:

sending, by the N1 second circuits, the N1 first code streams to a PHY of a first receiving apparatus, where the PHY of the first receiving apparatus includes N1 third circuits, and the N1 first code streams are in a one-to-one correspondence with the N1 third circuits; and each third circuit includes an alignment marker removal circuit, a descrambling circuit, and a physical layer decoding circuit; or each third circuit includes an alignment marker removal circuit and a descrambling circuit; or each third circuit includes an alignment marker removal circuit; or each third circuit includes a receiving circuit;

sending, by the N2 second circuits, the N2 third code streams to a PHY of a second receiving apparatus, where the PHY of the second receiving apparatus includes N2 fourth circuits, the N2 third code streams are in a one-to-one correspondence with the N2 fourth circuits, and the first receiving apparatus is different from the second receiving apparatus; and each fourth circuit includes an alignment marker removal circuit, a descrambling circuit, and a physical layer decoding circuit; or each fourth circuit includes an alignment marker removal circuit and a descrambling circuit; or each fourth circuit includes an alignment marker removal circuit; or each fourth circuit includes a receiving circuit.

With reference to the first aspect or any one of the foregoing possible implementation manners of the first aspect, in an eighth possible implementation manner of the first aspect, the method further includes:

sending, by the N1 second circuits, the N1 first code streams to a first PHY of a receiving apparatus, where the first PHY includes N1 third circuits, and the N1 first code streams are in a one-to-one correspondence with the N1 third circuits; and each third circuit includes an alignment marker removal circuit, a descrambling circuit, and a physical layer decoding circuit; or each third circuit includes an alignment marker removal circuit and a descrambling circuit; or each third circuit includes an alignment marker removal circuit; or each third circuit includes a receiving circuit;

sending, by the N2 second circuits, the N2 third code streams to a second PHY of the receiving apparatus, where the second PHY of the receiving apparatus includes N2 fourth circuits, and the N2 third code streams are in a one-to-one correspondence with the N2 fourth circuits; and each fourth circuit includes an alignment marker removal circuit, a descrambling circuit, and a physical layer decoding circuit; or each fourth circuit includes an alignment marker removal circuit and a descrambling circuit; or each fourth circuit includes an alignment marker removal circuit; or each fourth circuit includes a receiving circuit.

A second aspect of the present application provides a data aggregation method, including:

receiving, by N3 first circuits of M first circuits in a physical layer circuit PHY, N3 first code streams, where the N3 first circuits are in a one-to-one correspondence with the N3 first code streams;

processing, by the N3 first circuits, the received N3 first code streams to obtain N3 first data streams;

sending, by the N3 first circuits, the N3 first data streams to a second circuit;

processing, by the second circuit, the N3 first data streams to obtain a first data block stream; and combining the first data block stream to obtain a first packet stream;

where the second circuit includes a receiving circuit, the first data block stream is a data block stream obtained by aggregating the N3 first data streams, the N3 first data streams are data streams that are obtained after alignment marker removal, descrambling, and physical layer decoding are performed on the N3 first code streams, and each first circuit of the M first circuits includes an alignment marker removal circuit, a descrambling circuit, and a physical layer decoding circuit; or the second circuit includes a physical layer decoding circuit, the first data block stream is a data block stream that is obtained after physical layer decoding is performed on the N3 first data streams, the N3 first data streams are data streams that are obtained after alignment marker removal and descrambling are performed on the N3 first code streams, each first circuit of the M first circuits includes an alignment marker removal circuit and a descrambling circuit, and the second circuit is a circuit in the PHY; or the second circuit includes a descrambling circuit and a physical layer decoding circuit, the first data block stream is a data block stream that is obtained after descrambling and physical layer decoding are performed on the N3 first data streams, the N3 first data streams are data streams that are obtained after alignment marker removal is performed on the N3 first code streams, each first circuit of the M first circuits includes an alignment marker removal circuit, and the second circuit is a circuit in the PHY; or the second circuit includes an alignment marker removal circuit, a descrambling circuit, and a physical layer decoding circuit, the second circuit is a circuit in the PHY, each first circuit of the M first circuits includes a receiving circuit, the first data block stream is a data block stream that is obtained after alignment marker removal, descrambling, and physical layer decoding are performed, and the N3 first data streams are the N3 first code streams.

With reference to the second aspect, in a first possible implementation manner, the method further includes: disabling, in the M first circuits, at least one first circuit except the N3 first circuits.

With reference to the second aspect or the first possible implementation manner of the second aspect, in a second possible implementation manner, a maximum processing rate that can be provided by the N3 second circuits is greater than or equal to a rate of the N3 first code streams.

With reference to the second aspect, the first possible implementation manner of the second aspect, or the second possible implementation manner of the second aspect, in a third possible implementation manner, before the receiving, by N3 first circuits of the M first circuits, N3 first code streams, the method further includes:

receiving, by a demultiplexing circuit, X second code streams;

performing, by the demultiplexing circuit, demultiplexing processing on the X second code streams to obtain the N3 first code streams; and sending, by the demultiplexing circuit, the N3 first code streams to the N3 first circuits, where the X is a positive integer less than or equal to the N3.

With reference to the second aspect, the second possible implementation manner of the second aspect, or the third possible implementation manner of the second aspect, in a fourth possible implementation manner, the method further includes: receiving, by N4 first circuits of the M first circuits, N4 third code streams, where the N4 first circuits are in a one-to-one correspondence with the N4 third code streams, and an intersection between the N4 first circuits and the N3 first circuits is an empty set;

processing, by the N4 first circuits, the received N4 third code streams to obtain N4 second data streams;

sending, by the N4 first circuits, the N4 second data streams to the second circuit;

processing, by the second circuit, the N4 second data streams to obtain a second data block stream; and combining the second data block stream into a second packet stream;

where the second data block stream is a data block stream obtained by aggregating the N4 second data streams, and the N4 second data streams are data streams that are obtained after alignment marker removal, descrambling, and physical layer decoding are performed on the N4 third code streams;

or, the second data block stream is a data block stream that is obtained after physical layer decoding is performed on the N4 second data streams, and the N4 second data streams are data streams that are obtained after alignment marker removal and descrambling are performed on the N4 third code streams;

or, the second data block stream is a data block stream that is obtained after descrambling and physical layer decoding are performed on the N4 second data streams, and the N4 second data streams are data streams that are obtained after alignment marker removal is performed on the N4 third code streams;

or, the second data block stream is a data block stream that is obtained after alignment marker removal, descrambling, and physical layer decoding are performed, and the N4 second data streams are the N4 third code streams.

A third aspect of the present application provides a network device, including:

a media access controller MAC and a physical layer circuit PHY;

where the MAC is configured to receive a first packet stream, divide the first packet stream to obtain a first data block stream, and send the first data block stream to a first circuit;

the first circuit is configured to process the first data block stream to obtain a first data stream, and distribute the first data stream to N1 second circuits of M second circuits in the PHY, where the M is greater than the N1, the N1 is a positive integer, and the M is a positive integer; and the N1 second circuits are configured to process the received first data stream to obtain N1 first code streams, where the N1 second circuits are in a one-to-one correspondence with the N1 first code streams;

where the first circuit includes a receiving circuit, the first data stream is the first data block stream, and each second circuit of the M second circuits includes a physical layer encoding circuit, a scrambling circuit, and an alignment marker insertion circuit; or the first circuit includes a physical layer encoding circuit, the first data stream is a data stream that is obtained after physical layer encoding is performed on the first data block stream, each second circuit of the M second circuits includes a scrambling circuit and an alignment marker insertion circuit, and the first circuit is a circuit in the PHY; or the first circuit includes a physical layer encoding circuit and a scrambling circuit, the first data stream is a data stream that is obtained after physical layer encoding and scrambling are performed on the first data block stream, each second circuit of the M second circuits includes an alignment marker insertion circuit, and the first circuit is a circuit in the PHY; or the first circuit includes a physical layer encoding circuit, a scrambling circuit, and an alignment marker insertion circuit, the first data stream is a data stream that is obtained after physical layer encoding, scrambling, and alignment marker insertion are performed on the first data block stream, each second circuit of the M second circuits includes a receiving circuit, and the first circuit is a circuit in the PHY.

With reference to the third aspect, in a first possible implementation manner, the PHY is further configured to disable, in the M second circuits, at least one second circuit except the N1 second circuits.

With reference to the third aspect or the first possible implementation manner of the third aspect, in a second possible implementation manner, a maximum processing rate that can be provided by the N1 second circuits is greater than or equal to a rate of the first data block stream.

With reference to the third aspect, the first possible implementation manner of the third aspect, or the second possible implementation manner of the third aspect, in a third possible implementation manner, the network device further includes a multiplexing circuit, and the N1 second circuits are further configured to send the N1 first code streams to the multiplexing circuit; and the multiplexing circuit is configured to perform multiplexing processing on the N1 first code streams to obtain X second code streams, where the X is a positive integer less than or equal to the N1.

With reference to the third aspect, the second possible implementation manner of the third aspect, or the third possible implementation manner of the third aspect, in a fourth possible implementation manner, the MAC is further configured to receive a second packet stream, divide the second packet stream into a second data block stream, and send the second data block stream to the first circuit;

the first circuit is further configured to process the second data block stream to obtain a second data stream, and distribute the second data stream to N2 second circuits of the M second circuits in the PHY, where the M is greater than the N2, the N2 is a positive integer, and an intersection between the N2 second circuits and the N1 second circuits is an empty set; and the N2 second circuits are further configured to process the received second data stream to obtain N2 third code streams, where the N2 second circuits are in a one-to-one correspondence with the N2 third code streams;

where the second data stream is the second data block stream;

or, the second data stream is a data stream that is obtained after physical layer encoding is performed on the second data block stream;

or, the second data stream is a data stream that is obtained after physical layer encoding and scrambling are performed on the second data block stream;

or, the second data stream is a data stream that is obtained after physical layer encoding, scrambling, and alignment marker insertion are performed on the second data block stream.

With reference to the third aspect or any one of the foregoing possible implementation manners of the third aspect, in a fifth possible implementation manner of the third aspect, the N1 second circuits are further configured to send the N1 first code streams to a PHY of a receiving apparatus, where the PHY of the receiving apparatus includes only N1 third circuits, and the N1 first code streams are in a one-to-one correspondence with the N1 third circuits, where:

each third circuit includes an alignment marker removal circuit, a descrambling circuit, and a physical layer decoding circuit; or each third circuit includes an alignment marker removal circuit and a descrambling circuit; or each third circuit includes an alignment marker removal circuit; or each third circuit includes a receiving circuit.

With reference to the third aspect or any one of the foregoing possible implementation manners of the third aspect, in a sixth possible implementation manner of the third aspect, the N1 second circuits are further configured to send the N1 first code streams to a PHY of a receiving apparatus, where the PHY of the receiving apparatus includes M third circuits, and the N1 first code streams are in a one-to-one correspondence with N1 third circuits of the M third circuits, where:

each third circuit includes an alignment marker removal circuit, a descrambling circuit, and a physical layer decoding circuit; or each third circuit includes an alignment marker removal circuit and a descrambling circuit; or each third circuit includes an alignment marker removal circuit; or each third circuit includes a receiving circuit.

With reference to the third aspect or any one of the foregoing possible implementation manners of the third aspect, in a seventh possible implementation manner of the third aspect, the N1 second circuits are further configured to send the N1 first code streams to a PHY of a first receiving apparatus, where the PHY of the first receiving apparatus includes N1 third circuits, and the N1 first code streams are in a one-to-one correspondence with the N1 third circuits;

each third circuit includes an alignment marker removal circuit, a descrambling circuit, and a physical layer decoding circuit; or each third circuit includes an alignment marker removal circuit and a descrambling circuit; or each third circuit includes an alignment marker removal circuit; or each third circuit includes a receiving circuit;

the N2 second circuits are further configured to send the N2 third code streams to a PHY of a second receiving apparatus, where the PHY of the second receiving apparatus includes N2 fourth circuits, the N2 third code streams are in a one-to-one correspondence with the N2 fourth circuits, and the first receiving apparatus is different from the second receiving apparatus;

each fourth circuit includes an alignment marker removal circuit, a descrambling circuit, and a physical layer decoding circuit; or each fourth circuit includes an alignment marker removal circuit and a descrambling circuit; or each fourth circuit includes an alignment marker removal circuit; or each fourth circuit includes a receiving circuit.

With reference to the third aspect or any one of the foregoing possible implementation manners of the third aspect, in an eighth possible implementation manner of the third aspect, the N1 second circuits are further configured to send the N1 first code streams to a first PHY of a receiving apparatus, where the first PHY includes N1 third circuits, and the N1 first code streams are in a one-to-one correspondence with the N1 third circuits;

each third circuit includes an alignment marker removal circuit, a descrambling circuit, and a physical layer decoding circuit; or each third circuit includes an alignment marker removal circuit and a descrambling circuit; or each third circuit includes an alignment marker removal circuit; or each third circuit includes a receiving circuit;

the N2 second circuits are further configured to send the N2 third code streams to a second PHY of the receiving apparatus, where the second PHY of the receiving apparatus includes N2 fourth circuits, and the N2 third code streams are in a one-to-one correspondence with the N2 fourth circuits;

each fourth circuit includes an alignment marker removal circuit, a descrambling circuit, and a physical layer decoding circuit; or each fourth circuit includes an alignment marker removal circuit and a descrambling circuit; or each fourth circuit includes an alignment marker removal circuit; or each fourth circuit includes a receiving circuit.

A fourth aspect of the present application provides a network device, including:

a physical layer circuit PHY and a media access controller MAC;

where N3 first circuits of M first circuits in the PHY are configured to receive N3 first code streams, process the received first code streams to obtain N3 first data streams, and send the N3 first data streams to a second circuit, where the N3 first circuits are in a one-to-one correspondence with the N3 first code streams;

the second circuit is configured to process the N3 first data streams to obtain a first data block stream, and send the first data block stream to the MAC; and the MAC is configured to combine the first data block stream to obtain a first packet stream;

where the second circuit includes a receiving circuit, the first data block stream is a data block stream obtained by aggregating the N3 first data streams, the N3 first data streams are data streams that are obtained after alignment marker removal, descrambling, and physical layer decoding are performed on the N3 first code streams, and each first circuit of the M first circuits includes an alignment marker removal circuit, a descrambling circuit, and a physical layer decoding circuit; or the second circuit includes a physical layer decoding circuit, the first data block stream is a data block stream that is obtained after physical layer decoding is performed on the N3 first data streams, the N3 first data streams are data streams that are obtained after alignment marker removal and descrambling are performed on the N3 first code streams, each first circuit of the M first circuits includes an alignment marker removal circuit and a descrambling circuit, and the second circuit is a circuit in the PHY; or the second circuit includes a descrambling circuit and a physical layer decoding circuit, the first data block stream is a data block stream that is obtained after descrambling and physical layer decoding are performed on the N3 first data streams, the N3 first data streams are data streams that are obtained after alignment marker removal is performed on the N3 first code streams, each first circuit of the M first circuits includes an alignment marker removal circuit, and the second circuit is a circuit in the PHY; or the second circuit includes an alignment marker removal circuit, a descrambling circuit, and a physical layer decoding circuit, the second circuit is a circuit in the PHY, each first circuit of the M first circuits includes a receiving circuit, the first data block stream is a data block stream that is obtained after alignment marker removal, descrambling, and physical layer decoding are performed, and the N3 first data streams are the N3 first code streams.

With reference to the fourth aspect, in a first possible implementation manner, the PHY is further configured to disable, in the M first circuits, at least one first circuit except the N3 first circuits.

With reference to the fourth aspect or the first possible implementation manner of the fourth aspect, in a second possible implementation manner, a maximum processing rate that can be provided by the N3 first circuits is greater than or equal to a rate of the N3 first code streams.

With reference to the fourth aspect, the first possible implementation manner of the fourth aspect, or the second possible implementation manner of the fourth aspect, in a third possible implementation manner, the network device further includes a demultiplexing circuit;

where the demultiplexing circuit is configured to receive X second code streams, perform demultiplexing processing on the X second code streams to obtain the N3 first code streams, and send the N3 first code streams to the N3 first circuits, where the X is a positive integer less than or equal to the N3.

With reference to the fourth aspect, the second possible implementation manner of the fourth aspect, or the third possible implementation manner of the fourth aspect, in a fourth possible implementation manner, N4 first circuits of the M first circuits are further configured to receive N4 third code streams, process the received N4 third code streams to obtain N4 second data streams, and send the N4 second data streams to the second circuit, where the N4 first circuits are in a one-to-one correspondence with the N4 third code streams, and an intersection between the N4 first circuits and the N3 first circuits is an empty set;

the second circuit is further configured to process the N4 second data streams to obtain a second data block stream, and send the second data block stream to the MAC; and the MAC is further configured to combine the second data block stream into a second packet stream;

where the second data block stream is a data block stream obtained by aggregating the N4 second data streams, and the N4 second data streams are data streams that are obtained after alignment marker removal, descrambling, and physical layer decoding are performed on the N4 third code streams;

or, the second data block stream is a data block stream that is obtained after physical layer decoding is performed on the N4 second data streams, and the N4 second data streams are data streams that are obtained after alignment marker removal and descrambling are performed on the N4 third code streams;

or, the second data block stream is a data block stream that is obtained after descrambling and physical layer decoding are performed on the N4 second data streams, and the N4 second data streams are data streams that are obtained after alignment marker removal is performed on the N4 third code streams;

or, the second data block stream is a data block stream that is obtained after alignment marker removal, descrambling, and physical layer decoding are performed, and the N4 second data streams are the N4 third code streams.

A fifth aspect of the present application provides a computer storage medium, where the computer storage medium stores a program, and the program is configured to perform some or all steps of the foregoing data distribution method.

A sixth aspect of the present application provides a computer storage medium, where the computer storage medium stores a program, and the program is configured to perform some or all steps of the foregoing data aggregation method.

It can be seen from the foregoing that in some implementation manners of the present application, a first circuit processes a first data block stream to obtain a first data stream; the first circuit distributes the first data stream to N1 second circuits of M second circuits in a physical layer circuit, where the foregoing M is greater than the foregoing N1, and the foregoing N1 and M are positive integers; the foregoing N1 second circuits process the received first data stream to obtain N1 first code streams. Because the first circuit may selectively distribute the first data stream to the N1 second circuits of the M second circuits in the physical layer circuit as required, and does not need to distribute the first data stream to all the M second circuits in the physical layer circuit, this helps to implement that a physical layer sub-circuit with a corresponding processing capability is configured based on a size of an upper-layer packet stream, and diversified bandwidth modes instead of a fixed single bandwidth mode are presented externally. In this way, compared with the prior art, the technical solutions in the embodiments of the present application help to enhance flexibility of Ethernet bandwidth configuration and increase a resource reuse rate to a certain extent, to further meet a requirement for complex bandwidth configuration and extend an application scenario.

BRIEF DESCRIPTION OF DRAWINGS

To describe the technical solutions in the embodiments of the present application more clearly, the following briefly introduces the accompanying drawings required for describing the embodiments or the prior art. Apparently, the accompanying drawings in the following description show merely some embodiments of the present application, and a person of ordinary skill in the art may still derive other drawings from these accompanying drawings without creative efforts.

FIG. 2-a is a schematic flowchart of a data distribution method according to an embodiment of the present application;

FIG. 2-b is a schematic structural diagram of a network device according to an embodiment of the present application;

FIG. 2-c is a schematic structural diagram of another network device according to an embodiment of the present application;

FIG. 2-d is a schematic structural diagram of a first circuit and a second circuit according to an embodiment of the present application;

FIG. 2-e is a schematic structural diagram of another first circuit and another second circuit according to an embodiment of the present application;

FIG. 2-f is a schematic structural diagram of another first circuit and another second circuit according to an embodiment of the present application;

FIG. 2-g is a schematic structural diagram of another first circuit and another second circuit according to an embodiment of the present application;

FIG. 2-h is a schematic structural diagram of another network device according to an embodiment of the present application;

FIG. 2-i is a schematic structural diagram of another network device according to an embodiment of the present application;

FIG. 2-j is a schematic structural diagram of another network device according to an embodiment of the present application;

FIG. 2-k is a schematic structural diagram of another network device according to an embodiment of the present application;

FIG. 2-1 is a schematic diagram of interworking between a network device and a receiving apparatus according to an embodiment of the present application;

FIG. 2-m is a schematic diagram of interworking between another network device and a receiving apparatus according to an embodiment of the present application;

FIG. 2-n is a schematic diagram of interworking between another network device and a receiving apparatus according to an embodiment of the present application;

FIG. 2-o is a schematic diagram of interworking between another network device and a receiving apparatus according to an embodiment of the present application;

FIG. 3-a is a schematic structural diagram of another network device according to an embodiment of the present application;

FIG. 3-b is a schematic structural diagram of another network device according to an embodiment of the present application;

FIG. 3-c is a schematic structural diagram of another network device according to an embodiment of the present application;

FIG. 3-d is a schematic structural diagram of another network device according to an embodiment of the present application;

FIG. 4-a is a schematic flowchart of a data aggregation method according to an embodiment of the present application;

FIG. 4-b is a schematic structural diagram of a network device according to an embodiment of the present application;

FIG. 4-c is a schematic structural diagram of another network device according to an embodiment of the present application;

FIG. 4-*d* is a schematic structural diagram of a first circuit and a second circuit according to an embodiment of the present application;

FIG. 4-*e* is a schematic structural diagram of another first circuit and another second circuit according to an embodiment of the present application;

FIG. 4-*f* is a schematic structural diagram of another first circuit and another second circuit according to an embodiment of the present application;

FIG. 4-*g* is a schematic structural diagram of another first circuit and another second circuit according to an embodiment of the present application;

FIG. 4-*h* is a schematic structural diagram of another network device according to an embodiment of the present application;

FIG. 4-*i* is a schematic structural diagram of another network device according to an embodiment of the present application;

FIG. 4-*j* is a schematic structural diagram of another network device according to an embodiment of the present application;

FIG. 4-*k* is a schematic structural diagram of another network device according to an embodiment of the present application;

FIG. 5-*a* is a schematic structural diagram of another network device according to an embodiment of the present application;

FIG. 5-*b* is a schematic structural diagram of another network device according to an embodiment of the present application;

FIG. 5-*c* is a schematic structural diagram of another network device according to an embodiment of the present application; and FIG. 5-*d* is a schematic structural diagram of another network device according to an embodiment of the present application.

DESCRIPTION OF EMBODIMENTS

Figure 1:
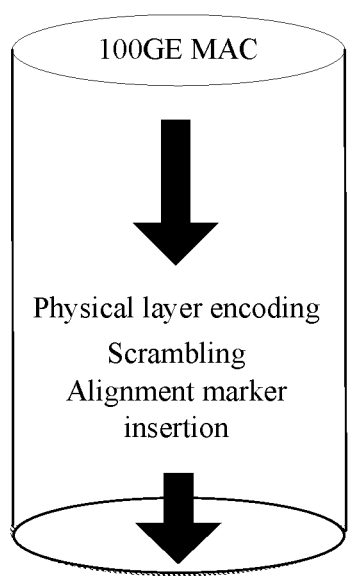
FIG. 1 is a schematic diagram of a fixed-rate Medium Access Control protocol layer interface implemented by using a single port in the prior art.

Embodiments of the present application provide a data distribution method, a data aggregation method, and related apparatuses, to meet a requirement for complex bandwidth configuration and extend an application scenario.

To make the objective, features, and merits of the present application more obvious and comprehensible, the following clearly describes the technical solutions in the embodiments of the present application with reference to the accompanying drawings in the embodiments of the present application. Obviously, the embodiments to be described below are only part of rather than all of the embodiments of the present application. All other embodiments obtained by a person of ordinary skill in the art based on the embodiments of the present application without creative efforts shall fall within the protection scope of the present application.

Terms "first", "second", "third", "fourth", and the like in the specification and the claims of the present application, and the foregoing accompanying drawings are used to differentiate different objects and are not used to describe a specific sequence. In addition, the terms "include", "have", and any variants of them are intended to cover a non-exclusive inclusion. For example, a process, a method, a system, a product, or a device that includes a series of steps or units is not limited to steps or units that have already been listed, but may include steps or units that are not listed.

According to an embodiment of the present application, a data distribution method may include: receiving a first packet stream; dividing the first packet stream to obtain a first data block stream; sending the first data block stream to a first circuit; processing, by the first circuit, the first data block stream to obtain a first data stream; distributing, by the first circuit, the first data stream to N1 second circuits of M second circuits in a physical layer circuit (PHY for short), where M is greater than N1, and N1 and M are positive integers; and processing, by the N1 second circuits, the received first data stream to obtain N1 first code streams, where the N1 second circuits are in a one-to-one correspondence with the N1 first code stream. The first circuit includes a receiving circuit, the first data stream is the first data block stream, and each second circuit of the M second circuits includes a physical layer encoding circuit, a scrambling circuit, and an alignment marker insertion circuit; or, the first circuit includes a physical layer encoding circuit, the first data stream is a data stream that is obtained after physical layer encoding is performed on the first data block stream, each second circuit of the M second circuits includes a scrambling circuit and an alignment marker insertion circuit, and the first circuit is a circuit in the PHY; or, the first circuit includes a physical layer encoding circuit and a scrambling circuit, the first data stream is a data stream that is obtained after physical layer encoding and scrambling are performed on the first data block stream, each second circuit of the M second circuits includes an alignment marker insertion circuit, and the first circuit is a circuit in the PHY; or, the first circuit includes a physical layer encoding circuit, a scrambling circuit, and an alignment marker insertion circuit, the first data stream is a data stream that is obtained after physical layer encoding, scrambling, and alignment marker insertion are performed on the first data block stream, each second circuit of the M second circuits includes a receiving circuit, and the first circuit is a circuit in the PHY.

Referring to FIG. 2-*a*, FIG. 2-*a* is a schematic flowchart of a data distribution method according to an embodiment of the present application. An entity for executing the data distribution method may be a network device, and the network device may be a router, a network switch, a firewall, a data center, a wavelength division multiplexing device, a load balancer, or another type of network device. As shown in FIG. 2-*a*, the data distribution method according to the embodiment of the present application may include the following content:

201. Receive a first packet stream.

An entity for executing step 201 may be a media access controller (media access controller, MAC for short).

The first packet stream refers to a data stream including a plurality of packets. For example, the first packet stream may be an IP packet stream or an Ethernet frame stream. The IP packet stream refers to a data stream including a plurality of IP packets. The Ethernet frame stream refers to a data stream including a plurality of Ethernet frames.

202. Divide the first packet stream to obtain a first data block stream.

In some embodiments of the present application, the dividing a first packet stream to obtain a first data block stream may include: dividing each packet of the first packet stream into blocks to obtain the first data block stream, where each packet may be divided into a plurality of data blocks.

For example, a blocking circuit in the MAC may divide the first packet stream to obtain a first data block stream.

203. Send the first data block stream to a first circuit.

For example, the blocking circuit in the MAC may send the first data block stream to the first circuit.

204. The first circuit processes the first data block stream to obtain a first data stream.

The first circuit may be a circuit in the MAC, or may be a circuit in a PHY.

205. The first circuit distributes the first data stream to N1 second circuits of M second circuits in a physical layer circuit PHY, where M is greater than N1, N1 is a positive integer, and M is a positive integer.

206. The N1 second circuits process the received first data stream to obtain N1 first code streams, where the N1 second circuits are in a one-to-one correspondence with the N1 first code streams.

For example, a first code stream of the N1 first code streams may be a serial bit stream. The N1 first code streams may be bit streams sent by a serializer/deserializer (serializer/deserializer, serdes for short).

Referring to FIG. 2-b and FIG. 2-c, FIG. 2-b and FIG. 2-c are two types of network devices capable of implementing the data distribution method shown in FIG. 2-a according to the embodiment of the present application. The network devices shown in FIG. 2-b and FIG. 2-c include a MAC and a physical layer circuit (PHY for short) each. In the network device shown in FIG. 2-b, the MAC includes a first circuit, and the PHY includes M second circuits. In the network device shown in FIG. 2-c, the PHY includes a first circuit and M second circuits.

The first circuit may include a receiving circuit. In this scenario, that the first circuit processes the first data block stream to obtain a first data stream may include that: the first circuit performs receiving processing on the first data block stream to obtain the first data stream. The first data stream is, for example, the first data block stream. Each second circuit of the M second circuits includes a physical layer encoding circuit, a scrambling circuit, and an alignment marker (alignment marker) insertion circuit. That the N1 second circuits process the received first data stream to obtain N1 first code streams may specifically include that: the N1 second circuits perform physical layer encoding processing on the received first data stream (specifically, the physical layer encoding circuit in each second circuit may perform scrambling processing on the received first data stream), perform scrambling processing on a data stream that has undergone the physical layer encoding processing (the scrambling circuit in each second circuit may perform scrambling processing on the received first data stream), and perform alignment marker insertion processing on a data stream that has undergone the scrambling processing (specifically, the alignment marker insertion circuit in each second circuit may perform alignment marker insertion processing on a data stream that has undergone the scrambling processing), to obtain the N1 first code streams. A possible circuit structure in this application scenario may be shown in FIG. 2-d. As shown in FIG. 2-d, a first circuit includes a receiving circuit, and a second circuit includes a physical layer encoding circuit, a scrambling circuit, and an alignment marker insertion circuit.

For example, the physical layer encoding may be 4b/5b encoding, 8b/10b encoding, 64b/66b encoding, or another type of physical layer encoding.

For details about an alignment marker, refer to IEEE802.3.

Optionally, the first circuit may include a physical layer encoding circuit. The first data stream is a data stream that is obtained after physical layer encoding is performed on the first data block stream. Each second circuit of the M second circuits may include a scrambling circuit and an alignment marker insertion circuit. The first circuit is a circuit in a PHY. In this scenario, that the first circuit processes the first data block stream to obtain a first data stream may include that: the first circuit performs physical layer encoding processing on the first data block stream to obtain the first data stream. That the N1 second circuits process the received first data stream to obtain N1 first code streams may specifically include that: the N1 second circuits perform scrambling processing on the received first data stream (specifically, the scrambling circuit in each second circuit may perform scrambling processing on the received first data stream), and perform alignment marker insertion processing on a data stream that has undergone the scrambling processing (specifically, the alignment marker insertion circuit in each second circuit may perform alignment marker insertion processing on a data stream that has undergone the scrambling processing), to obtain the N1 first code streams. A possible circuit structure in this application scenario may be shown in FIG. 2-e. As shown in FIG. 2-e, a first circuit includes a physical layer encoding circuit, and a second circuit includes a scrambling circuit and an alignment marker insertion circuit.

Optionally, the first circuit may include a physical layer encoding circuit and a scrambling circuit. The first data stream is a data stream that is obtained after physical layer encoding and scrambling are performed on the first data block stream. Each second circuit of the M second circuits includes an alignment marker insertion circuit. The first circuit is a circuit in a PHY. In this scenario, that the first circuit processes the first data block stream to obtain a first data stream may, for example, include that: the first circuit performs physical layer encoding processing on the first data block stream (specifically, the physical layer encoding circuit in the first circuit may perform physical layer encoding processing on the first data block stream), and performs scrambling processing on a data block stream that has undergone the physical layer encoding (specifically, the scrambling circuit in the first circuit may perform scrambling processing on the data block stream that has undergone the physical layer encoding processing), to obtain the first data stream. That the N1 second circuits process the received first data stream to obtain N1 first code streams may specifically include that: the N1 second circuits perform alignment marker insertion processing on the received first data stream to obtain the N1 first code streams. A possible circuit structure in this application scenario may be shown in FIG. 2-f. As shown in FIG. 2-f, a first circuit includes a physical layer encoding circuit and a scrambling circuit, and a second circuit includes an alignment marker insertion circuit.

Optionally, the first circuit may include a physical layer encoding circuit, a scrambling circuit, and an alignment marker insertion circuit. The first data stream is a data stream that is obtained after physical layer encoding, scrambling, and alignment marker insertion are performed on the first data block stream. Each second circuit of the M second circuits includes a receiving circuit. The first circuit is a circuit in a PHY. In this scenario, that the first circuit processes the first data block stream to obtain a first data stream may, for example, include that: the first circuit performs physical layer encoding processing on the first data block stream (specifically, the physical layer encoding circuit in the first circuit may perform physical layer encoding processing on the first data block stream), performs scrambling processing on a data block stream that has undergone the physical layer encoding (specifically, the scrambling circuit in the first circuit may perform scrambling processing on the data block stream that has undergone the physical layer encoding processing), and performs alignment marker insertion processing on a data block stream that has undergone the scrambling processing (specifically, the alignment marker insertion circuit in the first circuit may perform alignment marker insertion processing on the data block stream that has undergone the scrambling processing), to obtain the first data stream. A possible circuit structure in this application scenario may be shown in FIG. 2-g. As shown in FIG. 2-g, a first circuit includes a physical layer encoding circuit, a scrambling circuit, an alignment marker insertion circuit.

It can be seen that, in the embodiments, a first circuit processes a received first data block stream to obtain a first data stream; the first circuit distributes the first data stream to N1 second circuits of M second circuits in a physical layer circuit, where M is greater than N1, and N1 and M are positive integers; and the N1 second circuits process the received first data stream to obtain N1 first code streams. Because the first circuit may selectively distribute the first data stream to the N1 second circuits of the M second circuits in the physical layer circuit as required, and does not need to distribute the first data stream to all the M second circuits in the physical layer circuit, this helps to implement that a physical layer sub-circuit with a corresponding processing capability is configured based on a size of an upper-layer packet stream, and diversified bandwidth modes instead of a fixed single bandwidth mode are presented externally. In this way, compared with the prior art, the technical solutions of the embodiments help to enhance flexibility of Ethernet bandwidth configuration and increase a resource reuse rate to a certain extent, to further meet a requirement for complex bandwidth configuration and extend an application scenario.

In some embodiments of the present application, if M is greater than N1, in the M second circuit, at least one second circuit except the N1 second circuits may be further disabled. By disabling some idle second circuits, energy consumption may be reduced.

In some embodiments of the present application, a maximum processing rate that can be provided by the N1 second circuits is greater than or equal to a rate of the first data block stream. In an actual application, the number of participating second circuits may be determined (that is, a value of N1 is determined) based on the rate of the first data block stream. Certainly, N1 second circuits may also be directly configured to participate in related processing on the first data block stream. If the maximum processing rate that can be provided by the N1 second circuits is greater than or equal to the rate of the first data block stream, it is ensured that the first data block stream is processed instantly.

In some embodiments of the present application, after the N1 second circuits process the first data stream to obtain the N1 first code streams, the data distribution method may further include: sending, by the N1 second circuits, the N1 first code streams to a multiplexing circuit (multiplexer); performing, by the multiplexing circuit, multiplexing processing on the N1 first code streams to obtain X second code streams, where X is a positive integer less than or equal to N1, for example, X is equal to 1, 2, 3, or another positive integer. In this application scenario, a possible circuit structure may be shown in FIG. 2-h and FIG. 2-i, where the multiplexing circuit performs multiplexing processing on the N1 first code streams to obtain X second code streams. FIG. 2-h and FIG. 2-i also show that the multiplexing circuit may be replaced with a gearbox (gearbox) to change a rate of the first code streams.

In some other embodiments of the present application, after the N1 second circuits process the first data stream to obtain the N1 first code streams, the data distribution method may further include: sending, by N12 second circuits of the N1 second circuits, N12 first code streams to the multiplexing circuit; performing, by the multiplexing circuit, multiplexing processing on the N12 first code streams to obtain X2 second code streams, where X2 is a positive integer less than or equal to N12, for example, X2 may be equal to 1, 2, 3, or another positive integer. In this application scenario, a possible circuit structure may be shown in FIG. 2-j and FIG. 2-k, where the multiplexing circuit performs multiplexing processing on the N12 first code streams to obtain X2 second code streams. FIG. 2-j and FIG. 2-k also show that the multiplexing circuit may be replaced with a gearbox to change a rate of the first code streams.

The following describes an example of some application scenarios in which interaction is performed with a peer device (that is, a receiving apparatus).

The receiving apparatus may be a router, a network switch, a firewall, a data center, a wavelength division multiplexing device, a load balancer, or another type of network device.

In some embodiments of the present application, the data distribution method may further include: sending, by the N1 second circuits, the N1 first code streams to a PHY of the receiving apparatus, where the number of third circuits in the PHY of the receiving apparatus is N1 and the N1 first code streams are in a one-to-one correspondence with the N1 third circuits. Each third circuit includes an alignment marker removal circuit, a descrambling circuit, and a physical layer decoding circuit; or, each third circuit includes an alignment marker removal circuit and a descrambling circuit; or, each third circuit includes an alignment marker removal circuit; or, each third circuit includes a receiving circuit. In this application scenario, a possible circuit structure may be shown in FIG. 2-1. As shown in FIG. 2-1, the N1 second circuits may send the N1 first code streams to the PHY of the receiving apparatus, where the number of third circuits in the PHY of the receiving apparatus is N1.

In some other embodiments of the present application, the data distribution method may further include:

sending, by the N1 second circuits, the N1 first code streams to a PHY of a receiving apparatus, where the PHY of the receiving apparatus may include M2 third circuits, and the N1 first code streams are in a one-to-one correspondence with N1 third circuits of the M2 third circuits. Each third circuit includes an alignment marker removal circuit, a descrambling circuit, and a physical layer decoding circuit; or, each third circuit includes an alignment marker removal circuit and a descrambling circuit; or, each third circuit includes an alignment marker removal circuit; or, each third circuit includes a receiving circuit. M2 is greater than, equal to, or less than M. In this application scenario, a possible circuit structure may be shown in FIG. 2-m. As shown in FIG. 2-m, the N1 second circuits send the N1 first code streams to the PHY of the receiving apparatus, where the number of third circuits in the PHY of the receiving apparatus is M2.

In some embodiments of the present application, the first circuit and N2 second circuits of the M second circuits may further process another packet stream (which may be called a second packet stream), which helps to further increase a circuit reuse rate. For example, the data distribution method may further include:

receiving a second packet stream;
dividing the second packet stream into a second data block stream;
sending the second data block stream to the first circuit;
processing, by the first circuit, the second data block stream to obtain a second data stream;

distributing, by the first circuit, the second data stream to the N2 second circuits of the M second circuits in the PHY, where M is greater than N2, N2 is a positive integer, and an intersection between the N2 second circuits and the N1 second circuits is an empty set (that is, any second circuit of the N2 second circuits is different from any second circuit of the N1 second circuits. It may be understood that N1+N2 is less than or equal to M); and processing, by the N2 second circuits, the received second data stream to obtain N2 third code streams, where the N2 second circuits are in a one-to-one correspondence with the N2 third code streams;

where the second data stream is the second data block stream; or, the second data stream is a data stream that is obtained after physical layer encoding is performed on the second data block stream; or, the second data stream is a data stream that is obtained after physical layer encoding and scrambling are performed on the second data block stream; or, the second data stream is a data stream that is obtained after physical layer encoding, scrambling, and alignment marker insertion are performed on the second data block stream.

For example, "first" and "second" in the first packet stream and the second packet stream are used to differentiate packet streams of different attributes. An attribute of "the first packet stream" is different from an attribute of "the second packet stream". Specifically, a header of a packet in "the first packet stream" is different from a header of a packet in "the second packet stream". A header of a packet may be an outer header of the packet or a header carried in the packet.

For example, an outer header of an IP packet is an IP header. A layer of the header carried in the IP packet may be layer 2.5, layer 3, or layer 4. For example, a layer 2.5 protocol may be the Multiprotocol Label Switching (multi-protocol label switching, MPLS for short) protocol. A layer 3 protocol may be IP. A layer 4 protocol may be the Transmission Control Protocol (transmission control protocol, TCP for short). An outer header of an Ethernet frame is a frame header. A layer of the header carried in the Ethernet frame may be layer 2.5, layer 3, or layer 4. For layer 2.5, layer 3, or layer 4, refer to the Open System Interconnection—Reference Model (open system interconnection reference model).

The following describes an example of some other application scenarios in which interaction is performed with a peer device (that is, a receiving apparatus).

The receiving apparatus may be a router, a network switch, a firewall, a data center, a wavelength division multiplexing device, a load balancer, or another type of network device.

In some embodiments of the present application, the data distribution method may further include: sending, by the N1 second circuits, the N1 first code streams to a PHY of a first receiving apparatus, where the PHY of the first receiving apparatus includes N1 third circuits, and the N1 first code streams are in a one-to-one correspondence with the N1 third circuits; and each third circuit includes an alignment marker removal circuit, a descrambling circuit, and a physical layer decoding circuit; or, each third circuit includes an alignment marker removal circuit and a descrambling circuit; or, each third circuit includes an alignment marker removal circuit; or, each third circuit includes a receiving circuit. The N2 second circuits further send the N2 third code streams to a PHY of a second receiving apparatus, where the PHY of the second receiving apparatus includes N2 fourth circuits, the N2 third code streams are in a one-to-one correspondence with the N2 fourth circuits, and the first receiving apparatus is different from the second receiving apparatus. Each fourth circuit includes an alignment marker removal circuit, a descrambling circuit, and a physical layer decoding circuit; or, each fourth circuit includes an alignment marker removal circuit and a descrambling circuit; or, each fourth circuit includes an alignment marker removal circuit; or, each fourth circuit includes a receiving circuit. In this application scenario, a possible circuit structure may be shown in FIG. 2-*n*, where the N1 second circuits send the N1 first code streams to the PHY of the first receiving apparatus, and the N2 second circuits send the N2 first code streams to the PHY of the second receiving apparatus. The number of third circuits in the PHY of the first receiving apparatus is N1. The number of fourth circuits in the PHY of the second receiving apparatus is N2.

In some other embodiments of the present application, the data distribution method may further include: sending, by the N1 second circuits, the N1 first code streams to a first PHY of a receiving apparatus, where the first PHY includes N1 third circuits, and the N1 first code streams are in a one-to-one correspondence with the N1 third circuits. Each third circuit includes an alignment marker removal circuit, a descrambling circuit, and a physical layer decoding circuit; or, each third circuit includes an alignment marker removal circuit and a descrambling circuit; or, each third circuit includes an alignment marker removal circuit; or, each third circuit includes a receiving circuit. The N2 second circuits may further send the N2 third code streams to a second PHY of the receiving apparatus, where the second PHY of the receiving apparatus includes N2 fourth circuits, and the N2 third code streams are in a one-to-one correspondence with the N2 fourth circuits. Each fourth circuit includes an alignment marker removal circuit, a descrambling circuit, and a physical layer decoding circuit; or, each fourth circuit includes an alignment marker removal circuit and a descrambling circuit; or, each fourth circuit includes an alignment marker removal circuit; or, each fourth circuit includes a receiving circuit. In this application scenario, a possible circuit structure may be shown in FIG. 2-*o*, where the N1 second circuits send the N1 first code streams to the first PHY of the receiving apparatus, and the N2 second circuits send the N2 first code streams to the second PHY of the receiving apparatus. The number of third circuits in the first PHY of the receiving apparatus is N1. The number of fourth circuits in the second PHY of the receiving apparatus is N2.

In some actual applications, a local network device may also perform data transmission with another device in another manner, which is not further described herein.

The following further describes an example of a more practical application scenario of data distribution.

It is assumed that a network layer of a network device produces a first packet stream with a maximum rate of 100 Gpbs and a second packet stream with a maximum rate of 200 Gpbs simultaneously, where a maximum processing capability of a MAC and a PHY of the network device is 400 Gpbs; and it is assumed that the PHY has 16 second circuits, where a maximum processing rate of each second circuit is 25 Gpbs. Therefore, 4 second circuits of the 16 second circuits are configured to perform related processing on the first packet stream, and 8 second circuits of the 16 second circuits are configured to perform related processing on the second packet stream. The first circuit includes a physical layer encoding circuit, and each second circuit includes a scrambling circuit and an alignment marker insertion circuit.

After receiving the first packet stream, the MAC divides the first packet stream to obtain a first data block stream; the MAC sends the first data block stream to the first circuit; the physical layer encoding circuit in the first circuit performs physical layer encoding processing on the first data block stream to obtain a first data stream; the first circuit distributes the first data stream (that is, the first data stream is divided into 4 parts) to the 4 second circuits of the 16 second circuits in the PHY; and the 4 second circuits perform scrambling processing and alignment marker insertion processing on the received first data stream to obtain 4 first code streams, where the 4 second circuits are in a one-to-one correspondence with the 4 first code streams.

Similarly, after receiving the second packet stream, the MAC divides the second packet stream into a second data block stream; the MAC sends the second data block stream to the first circuit; the physical layer encoding circuit in the first circuit performs physical layer encoding processing on the second data block stream to obtain a second data stream; the first circuit distributes the second data stream (that is, the second data stream is divided into 8 parts) to 8 second circuits (certainly, the 8 second circuits are different from the foregoing 4 second circuits) of the 16 second circuits in the PHY; and the 8 second circuits perform scrambling processing and alignment marker insertion processing on the received second data stream to obtain 8 third code streams, where the 8 second circuits are in a one-to-one correspondence with the 8 third code streams.

Because there are still 4 idle second circuits in the current PHY, the PHY may disable the 4 idle second circuits.

It can be seen from the foregoing example that based on the solution of the embodiment of the present application, the network device can simultaneously process a plurality of packet streams corresponding to different services, support interface configuration of a smaller granularity, and can present interfaces of a plurality of rates externally, which helps to implement more flexible networking, improve resource utilization, and reduce energy consumption, and further helps to meet a requirement for complex bandwidth configuration and extend an application scenario.

It can be seen that, because a plurality of second circuits is introduced in the embodiments, interface configuration of a smaller granularity may be supported, and the number of second circuits participating in processing may be dynamically configured as required, which helps to implement more flexible networking.

Further, because the MAC and the PHY may have different working bandwidth (for example, the bandwidth of the MAC is 400 G, while the PHY may include 40 second circuits with a 10 G bandwidth each). Compared with a technology that the MAC and the PHY have same working bandwidth, in the solutions of the embodiments, higher resource utilization is achieved, and configuration and networking become more flexible. Further, the number of working second circuits in the PHY may be configured, which helps to implement a seamless IP+optical combination with a future optical network of flexible bandwidth, and resolve a problem of possible load imbalance between different links in a case of per-flow/per-packet load sharing. By selecting a location of a circuit to be distributed, resource reuse can be maximized. In addition, a mechanism such as a hierarchical distribution and aggregation mechanism, and a pre-processing mechanism may be used to achieve a purpose of further saving resources.

For better understanding and implementation of the data distribution solutions of the embodiments of the present application, the following further provides a related apparatus configured to implement the data distribution solution.

Referring to FIG. 3-*a* and FIG. 3-*b*, an embodiment of the present application further provides a network device 300. The network device 300 may be configured to perform the method shown in FIG. 2-*a*. The network device 300 may be a router, a network switch, a firewall, a data center, a wavelength division multiplexing device, a load balancer, or another type of network device. The network device 300 may include:

a MAC 310 and a PHY 320.

The MAC 310 is configured to receive a first packet stream, divide the first packet stream to obtain a first data block stream, and send the first data block stream to a first circuit 311.

The first circuit 311 is configured to process the first data block stream to obtain a first data stream, and distribute the first data stream to N1 second circuits of M second circuits in the PHY; where M is greater than N1, N1 is a positive integer, and M is a positive integer.

In an application scenario in which the first circuit 311 is located in the MAC 310, that the MAC 310 divides the first packet stream to obtain a first data block stream, and sends the first data block stream to a first circuit may include that: a blocking circuit in the MAC 310 divides the first packet stream into the first data block stream, and sending the first data block stream to the first circuit 311.

N1 second circuits 321 are configured to process the received first data stream to obtain N1 first code streams, where the N1 second circuits 321 are in a one-to-one correspondence with the N1 first code streams.

The first circuit 311 includes a receiving circuit, and the first data stream is the first data block stream. Each second circuit 321 of the M second circuits 321 includes a physical layer encoding circuit, a scrambling circuit, and an alignment marker insertion circuit.

Optionally, the first circuit 311 includes a physical layer encoding circuit; the first data stream is a data stream that is obtained after physical layer encoding is performed on the first data block stream, each second circuit 321 of the M second circuits 321 includes a scrambling circuit and an alignment marker insertion circuit, and the first circuit 311 is a circuit in the PHY 320.

Optionally, the first circuit 311 includes a physical layer encoding circuit and a scrambling circuit; the first data stream is a data stream that is obtained after physical layer encoding and scrambling are performed on the first data block stream, each second circuit 321 of the M second circuits 321 includes an alignment marker insertion circuit, and the first circuit 311 is a circuit in the PHY 320.

Optionally, the first circuit 311 may include a physical layer encoding circuit, a scrambling circuit, and an alignment marker insertion circuit; the first data stream is a data stream that is obtained after physical layer encoding, scrambling, and alignment marker insertion are performed on the first data block stream, each second circuit 321 of the M second circuits 321 includes a receiving circuit, and the first circuit 311 is a circuit in the PHY 320.

The first packet stream refers to a data stream including a plurality of packets. For example, the first packet stream may be an IP packet stream or an Ethernet frame stream. The IP packet stream refers to a data stream including a plurality of IP packets. The Ethernet frame stream refers to a data stream including a plurality of Ethernet frames.

In some embodiments of the present application, the PHY 320 is further configured to disable, in the M second circuits 321, at least one second circuit 321 except the N1 second circuits 321.

In some embodiments of the present application, a maximum processing rate that can be provided by the N1 second circuits 321 is greater than or equal to a rate of the first data block stream.

Referring to FIG. 3-*c* and FIG. 3-*d*, in some embodiments of the present application, the network device 300 may further include:

a multiplexing circuit 330; and the N1 second circuits 321 are further configured to send N1 first code streams to the multiplexing circuit 330.

The multiplexing circuit 330 is configured to perform multiplexing processing on the N1 first code streams to obtain X second code streams, where X is a positive integer less than or equal to N1.

In some embodiments of the present application, the MAC 310 may be further configured to receive a second packet stream, divide the second packet stream into a second data block stream, and send the second data block stream to the first circuit;

the first circuit 311 is further configured to process the second data block stream to obtain a second data stream, and distribute the second data stream to N2 second circuits of the M second circuits in the PHY, where M is greater than N2, N2 is a positive integer, and an intersection between the N2 second circuits and the N1 second circuits is an empty set; and the N2 second circuits 321 are further configured to process the received second data stream to obtain N2 third code streams, where the N2 second circuits are in a one-to-one correspondence with the N2 third code streams.

The second data stream is the second data block stream.

Optionally, the second data stream is a data stream that is obtained after physical layer encoding is performed on the second data block stream.

Optionally, the second data stream is a data stream that is obtained after physical layer encoding and scrambling are performed on the second data block stream.

Optionally, the second data stream is a data stream that is obtained after physical layer encoding, scrambling, and alignment marker insertion are performed on the second data block stream.

For example, "first" and "second" in the first packet stream and the second packet stream are used to differentiate packet streams of different attributes. An attribute of "the first packet stream" is different from an attribute of "the second packet stream". Specifically, a header of a packet in "the first packet stream" is different from a header of a packet in "the second packet stream". A header of a packet may be an outer header of the packet or a header carried in the packet.

For example, an outer header of an IP packet is an IP header. A layer of the header carried in the IP packet may be layer 2.5, layer 3, or layer 4. For example, a layer 2.5 protocol may be the MPLS protocol. A layer 3 protocol may be IP. A layer 4 protocol may be TCP. An outer header of an Ethernet frame may be a frame header. A layer of the header carried in the Ethernet frame may be layer 2.5, layer 3, or layer 4. For layer 2.5, layer 3 or layer 4, refer to the Open System Interconnection—Reference Model.

In some embodiments of the present application, the N1 second circuits 321 are further configured to send the N1 first code streams to a PHY of a receiving apparatus. The PHY of the receiving apparatus may, for example, include only N1 third circuits, and the N1 first code streams are in a one-to-one correspondence with the N1 third circuits. Each third circuit includes an alignment marker removal circuit, a descrambling circuit, and a physical layer decoding circuit; or, each third circuit includes an alignment marker removal circuit and a descrambling circuit; or, each third circuit includes an alignment marker removal circuit; or, each third circuit includes a receiving circuit.

In some other embodiments of the present application, the N1 second circuits 321 are further configured to send the N1 first code streams to a PHY of a receiving apparatus, where the PHY of the receiving apparatus may include M2 third circuits, and the N1 first code streams are in a one-to-one correspondence with the N1 third circuits of the M2 third circuits. Each third circuit includes an alignment marker removal circuit, a descrambling circuit, and a physical layer decoding circuit; or, each third circuit includes an alignment marker removal circuit and a descrambling circuit; or, each third circuit includes an alignment marker removal circuit; or, each third circuit includes a receiving circuit. M2 is greater than, equal to, or less than M.

In some other embodiments of the present application, the N1 second circuits 321 may be further configured to send the N1 first code streams to a PHY of a first receiving apparatus, where the PHY of the first receiving apparatus includes N1 third circuits, and the N1 first code streams are in a one-to-one correspondence with the N1 third circuits; and each third circuit includes an alignment marker removal circuit, a descrambling circuit, and a physical layer decoding circuit; or, each third circuit includes an alignment marker removal circuit and a descrambling circuit; or, each third circuit includes an alignment marker removal circuit; or, each third circuit includes a receiving circuit.

The N2 second circuits 321 may be further configured to send N2 second code streams to a PHY of a second receiving apparatus, where the PHY of the second receiving apparatus includes N2 fourth circuits, and the N2 second code streams are in a one-to-one correspondence with the N2 fourth circuits. The first receiving apparatus is different from the second receiving apparatus, and each fourth circuit includes an alignment marker removal circuit, a descrambling circuit, and a physical layer decoding circuit; or, each fourth circuit includes an alignment marker removal circuit and a descrambling circuit; or, each fourth circuit includes an alignment marker removal circuit; or, each fourth circuit includes a receiving circuit.

In some other embodiments of the present application, the N1 second circuits 321 may be further configured to send the N1 first code streams to a first PHY of a receiving apparatus. The first PHY includes N1 third circuits, and the N1 first code streams are in a one-to-one correspondence with the N1 third circuits. Each third circuit includes an alignment marker removal circuit, a descrambling circuit, and a physical layer decoding circuit; or, each third circuit includes an alignment marker removal circuit and a descrambling circuit; or, each third circuit includes an alignment marker removal circuit; or, each third circuit includes a receiving circuit.

The N2 second circuits 321 may be further configured to send the N2 second code streams to a second PHY of a receiving apparatus, where the second PHY of the receiving apparatus includes N2 fourth circuits, and the N2 second code streams are in a one-to-one correspondence with the N2 fourth circuits. Each fourth circuit includes an alignment marker removal circuit, a descrambling circuit, and a physical layer decoding circuit; or, each fourth circuit includes an alignment marker removal circuit and a descrambling circuit; or, each fourth circuit includes an alignment marker removal circuit; or, each fourth circuit includes a receiving circuit.

It can be seen that, in the embodiments, a first circuit of a network device 300 processes a received first data block stream to obtain a first data stream; the first circuit distributes the first data stream to N1 second circuits of M second circuits in a physical layer circuit, where M is greater than N1, and the N1 and the M are positive integers; and the N1 second circuits process the received first data stream to obtain N1 first code streams. Because the first circuit may selectively distribute the first data stream to the N1 second circuits of the M second circuits in the physical layer circuit as required, and does not need to distribute the first data stream to all the M second circuits in the physical layer circuit, this helps to implement that a physical layer sub-circuit with a corresponding processing capability is configured based on a size of an upper-layer packet stream, and diversified bandwidth modes instead of a fixed single bandwidth mode are presented externally. In this way, compared with the prior art, the technical solutions of the embodiments help to enhance flexibility of Ethernet bandwidth configuration and increase a resource reuse rate to a certain extent, to further meet a requirement for complex bandwidth configuration and extend an application scenario.

Further, in the embodiments, because a plurality of second circuits is introduced, interface configuration of a smaller granularity may be supported, and the number of second circuits participating in processing may be dynamically configured as required, which helps to implement more flexible networking.

Further, because the MAC and the PHY may have different working bandwidth (for example, the bandwidth of the MAC is 400 G, while the PHY may include 40 second circuits with a 10 G bandwidth each). Compared with a technology that the MAC and the PHY have same working bandwidth, in the solutions of the embodiments, higher resource utilization is achieved, and configuration and networking become more flexible. Further, the number of working second circuits in the PHY may be configured, which helps to implement a seamless IP+optical combination with a future optical network of flexible bandwidth, and resolve a problem of possible load imbalance between different links in a case of per-flow/per-packet load sharing. By selecting a location of a circuit to be distributed, resource reuse can be maximized. In addition, a mechanism such as a hierarchical distribution and aggregation mechanism, and a pre-processing mechanism may be used to achieve a purpose of further saving resources.

In an embodiment of a data aggregation method in the present application, a data aggregation method may specifically include: receiving, by N3 first circuits of M first circuits in a PHY, N3 first code streams, where the N3 first circuits are in a one-to-one correspondence with the N3 first code streams; processing, by the N3 first circuits, the received N3 first code streams to obtain N3 first data streams; sending, by the N3 first circuits, the N3 first data streams to a second circuit; processing, by the second circuit, the N3 first data streams to obtain a first data block stream; and combining the first data block stream to obtain a first packet stream. The second circuit includes a receiving circuit, the first data block stream is a data block stream obtained by aggregating the N3 first data streams, the N3 first data streams are data streams that are obtained after alignment marker removal, descrambling, and physical layer decoding are performed on the N3 first code streams, and each first circuit of the M first circuits includes an alignment marker removal circuit, a descrambling circuit, and a physical layer decoding circuit; or, the second circuit includes a physical layer decoding circuit, the first data block stream is a data block stream that is obtained after physical layer decoding is performed on the N3 first data streams, the N3 first data streams are data streams that are obtained after alignment marker removal and descrambling are performed on the N3 first code streams, each first circuit of the M first circuits includes an alignment marker removal circuit and a descrambling circuit, and the second circuit is a circuit in the PHY; or, the second circuit includes a descrambling circuit and a physical layer decoding circuit, the first data block stream is a data block stream that is obtained after descrambling and physical layer decoding are performed on the N3 first data streams, the N3 first data streams are data streams that are obtained after alignment marker removal is performed on the N3 first code streams, each first circuit of the M first circuits includes an alignment marker removal circuit, and the second circuit is a circuit in the PHY; or, the second circuit includes an alignment marker removal circuit, a descrambling circuit, and a physical layer decoding circuit, the second circuit is a circuit in the PHY, each first circuit of the M first circuits includes a receiving circuit, the first data block stream is a data block stream that is obtained after alignment marker removal, descrambling, and physical layer decoding are performed, and the N3 first data streams are the N3 first code streams.

Referring to FIG. 4-a, FIG. 4-a is a schematic flowchart of a data aggregation method according to an embodiment of the present application. An entity for executing the data aggregation method may be a network device. The network device may be a router, a network switch, a firewall, a data center, a wavelength division multiplexing device, a load balancer, or another type of network device. As shown in FIG. 4-a, the data aggregation method according to the embodiment of the present application may include the following content:

401. N3 first circuits of M first circuits in a PHY receive N3 first code streams.

The N3 first circuits are in a one-to-one correspondence with the N3 first code streams.

For example, the N3 first code streams may be obtained in the following way:

dividing a packet stream into a data block stream; distributing the data block stream to obtain N3 sub data block streams; performing physical layer encoding on the N3 sub data block streams to obtain N3 sub data block streams that have undergone the physical layer encoding; performing scrambling on the N3 sub data block streams that have undergone the physical layer encoding to obtain N3 scrambled sub data block streams; and performing alignment marker insertion on the N3 scrambled sub data block streams to obtain N3 first code streams.

For another example, the N3 first code streams may be obtained in the following way:

dividing a packet stream into a data block stream; performing physical layer encoding on the data block stream to obtain a data block stream that has undergone the physical layer encoding; distributing the data block stream that has undergone the physical layer encoding to obtain N3 sub data block streams that have undergone the physical layer encoding; performing scrambling on the N3 sub data block streams that have undergone the physical layer encoding to obtain N3 scrambled sub data block streams; and performing alignment marker insertion on the N3 scrambled sub data block streams to obtain N3 first code streams.

For still another example, the N3 first code streams may be obtained in the following way:

dividing a packet stream into a data block stream; performing physical layer encoding on the data block stream to obtain a data block stream that has undergone the physical layer encoding; performing scrambling on the data block stream that has undergone the physical layer encoding to obtain a scrambled data block stream; dividing the scrambled data block stream into N3 scrambled sub data block streams; and performing alignment marker insertion on the N3 scrambled sub data block streams to obtain N3 first code streams.

For yet another example, the N3 first code streams may be obtained in the following way:

dividing a packet stream into a data block stream; performing physical layer encoding on the data block stream to obtain a data block stream that has undergone the physical layer encoding; performing scrambling on the data block stream that has undergone the physical layer encoding to obtain a scrambled data block stream; performing alignment marker insertion on the scrambled data block stream to obtain a code stream; and distributing the code stream to obtain N3 first code streams.

For example, a first code stream of the N3 first code streams may be a serial bit stream. The N3 first code streams may be bit streams sent by a serdes.

402. The N3 first circuits process the received N3 first code streams to obtain N3 first data streams.

403. The N3 first circuits send the N3 first data streams to a second circuit.

404. The second circuit processes the N3 first data streams to obtain a first data block stream.

405. Combine the first data block stream to obtain a first packet stream.

An entity for executing step 405 may be a MAC.

In some embodiments of the present application, the first data block stream includes a plurality of data blocks. The combining the first data block stream to obtain a first packet stream; may specifically include: combining a plurality of data blocks that are in the first data block stream and belong to a same packet into a packet, where a plurality of combined packets forms a first packet stream. For example, the second circuit may send the first data block stream to a block combining circuit in the MAC, and the block combining circuit in the MAC combines the first data block stream to obtain a first packet stream.

Referring to FIG. 4-*b* and FIG. 4-*c*, FIG. 4-*b* and FIG. 4-*c* are two types of network devices capable of implementing the data aggregation method shown in FIG. 4-*a* according to the embodiment of the present application. The network devices shown in FIG. 4-*b* and FIG. 4-*c* include a MAC and a PHY each. In the network device shown in FIG. 4-*b*, the MAC includes a second circuit, and the PHY includes M first circuits. In the network device shown in FIG. 4-*c*, the PHY includes a second circuit and M first circuits.

The second circuit includes a receiving circuit, and the first data block stream is a data block stream obtained by aggregating the N3 first data streams. The N3 first data streams are data streams that are obtained after alignment marker removal, descrambling, and physical layer decoding are performed on the N3 first code streams. Each first circuit of the M first circuits includes an alignment marker removal circuit, a descrambling circuit, and a physical layer decoding circuit. In this scenario, that the second circuit processes the N3 first data streams to obtain a first data block stream may include that: the second circuit performs aggregation processing on the N3 first data streams to obtain the first data block stream. That the N3 first circuits process the received N3 first code streams to obtain N3 first data streams may specifically include that: the N3 first circuits perform alignment marker removal processing on the received N3 first code streams (the alignment marker removal circuit in each first circuit may perform alignment marker removal processing on the received first data stream), performing descrambling processing on the code streams that have undergone the alignment marker removal processing (the descrambling circuit in each first circuit may perform descrambling processing on the code streams that have undergone the alignment marker removal processing), and performing physical layer decoding processing on the code streams that have undergone the descrambling processing (the physical layer decoding circuit in each first circuit may perform physical layer decoding processing on the code streams that have undergone the descrambling circuit), to obtain the N3 first data streams. In this application scenario, a possible circuit structure may be shown in FIG. 4-*d*. In FIG. 4-*d*, a second circuit includes a receiving circuit, and a first circuit includes a physical layer decoding circuit, a descrambling circuit, and an alignment marker removal circuit.

For example, the physical layer decoding may be 5b/4b decoding, 10b/8b decoding, 66b/64b decoding, or another type of physical layer decoding.

For an alignment marker, refer to IEEE802.3.

Optionally, the second circuit may include a physical layer decoding circuit, where the first data block stream is a data block stream that is obtained after physical layer decoding is performed on the N3 first data streams. The N3 first data streams are data streams that are obtained after alignment marker removal and descrambling are performed on the N3 first code streams. Each first circuit of the M first circuits includes an alignment marker removal circuit and a descrambling circuit, and the second circuit is a circuit in a PHY. In this scenario, that the second circuit processes the N3 first data streams to obtain a first data block stream may include that: the second circuit performs physical layer decoding processing on the N3 first data streams to obtain the first data block stream. That the N3 first circuits process the received N3 first code streams to obtain N3 first data streams may specifically include that: the N3 first circuits perform alignment marker removal processing on the received N3 first code streams (the alignment marker removal circuit in each first circuit may perform alignment marker removal processing on the received first data stream), and performing descrambling processing on the code streams that have undergone the alignment marker removal processing (the descrambling circuit in each first circuit may perform descrambling processing on the code streams that have undergone the alignment marker removal processing), to obtain the N3 first data streams. In this application scenario, a possible circuit structure may be shown in FIG. 4-*e*. In FIG. 4-*e*, a second circuit includes a physical layer decoding circuit, and a first circuit includes a descrambling circuit and an alignment marker removal circuit.

Optionally, the second circuit may include a descrambling circuit and a physical layer decoding circuit, where the first data block stream is a data block stream that is obtained after descrambling and physical layer decoding are performed on the N3 first data streams. The N3 first data streams are data streams that are obtained after alignment marker removal is performed on the N3 first code streams. Each first circuit of the M first circuits includes an alignment marker removal circuit. The second circuit is a circuit in a PHY. In this scenario, that the second circuit processes the N3 first data streams to obtain a first data block stream may include that: the second circuit performs descrambling processing on the N3 first data streams (the descrambling circuit in the second circuit may perform descrambling processing on the N3 first data streams), and performing physical layer decoding processing on the data streams that have undergone the descrambling processing (the physical layer decoding circuit in the second circuit may perform physical layer decoding processing on the data streams that have undergone the descrambling processing), to obtain the first data block stream. That the N3 first circuits process the received N3 first code streams to obtain N3 first data streams may include that: the N3 first circuits perform alignment marker removal processing on the received N3 first code streams (the alignment marker removal circuit in each first circuit may perform alignment marker removal processing on the received first code streams) to obtain the N3 first data streams. In this application scenario, a possible circuit structure may be shown in FIG. 4-f. In FIG. 4-f, a second circuit includes a physical layer decoding circuit and a descrambling circuit, and a first circuit includes an alignment marker removal circuit.

Optionally, the second circuit may also include an alignment marker removal circuit, a descrambling circuit, and a physical layer decoding circuit. The first data block stream is a data block stream that is obtained after alignment marker removal, descrambling, and physical layer decoding are performed. The N3 first data streams are N3 first code streams, and the second circuit is a circuit in a PHY. Each first circuit of the M first circuits includes a receiving circuit. In this scenario, that the second circuit processes the N3 first data streams to obtain a first data block stream may include that: the second circuit performs alignment marker removal processing on the N3 first data streams (specifically, the alignment marker removal circuit in the second circuit may perform alignment marker removal processing on the N3 first data streams), performing descrambling processing on the data streams that have undergone the alignment marker removal processing (specifically, the descrambling circuit in the second circuit may perform descrambling processing on the N3 first data streams), and performing physical layer decoding processing on the data streams that have undergone the descrambling processing (the physical layer decoding circuit in the second circuit may perform physical layer decoding processing on the data streams that have undergone the descrambling processing), to obtain the first data block stream. That the N3 first circuits process the received N3 first code streams to obtain N3 first data streams may include that: the N3 first circuits perform receiving processing on the received N3 first code streams to obtain the N3 first data streams. A possible circuit structure in this application scenario may be shown in FIG. 4-g. As shown in FIG. 4-g, a second circuit includes a physical layer decoding circuit, a descrambling circuit, an alignment marker removal circuit.

In some embodiments of the present application, if M is greater than N1, in the M first circuits, at least one first circuit except the N3 first circuits may be further disabled. By disabling some idle first circuits, energy consumption may be reduced.

In some embodiments of the present application, a maximum processing rate that can be provided by the N3 first circuits is greater than or equal to a rate of the N3 first code streams. In an actual application, the number of participating first circuits may be determined (that is, a value of N3 is determined) based on the rate of the first data block stream. Certainly, N3 first circuits may also be directly configured to participate in related processing on the first code streams. If the maximum processing rate that can be provided by the N2 first circuits is greater than or equal to the rate of the first code streams, it is ensured that the first code streams are processed instantly.

In some embodiments of the present application, before the N3 first circuits of the M first circuits receive the N3 first code streams, the data aggregation method may further include: receiving, by a demultiplexing circuit (demultiplexer), X second code streams; performing, by the demultiplexing circuit, demultiplexing processing on the X second code streams to obtain N3 first code streams, and sending the N3 first code streams to the N3 first circuits; where X is a positive integer less than or equal to N3, for example, X is equal to 1, 2, 3, or another positive integer. In this application scenario, a possible circuit structure may be shown in FIG. 4-h, where the demultiplexing circuit performs demultiplexing processing on the X second code streams to obtain N3 first code streams.

In some embodiments of the present application, the data aggregation method may further include: receiving, by N4 first circuits of the M first circuits, N4 third code streams, and processing, by the N4 first circuits, the received N4 third code streams to obtain N4 second data streams; sending, by the N4 first circuits, the N4 second data streams to a second circuit; processing, by the second circuit, the N4 second data streams to obtain a second data block stream; and combining the second data block stream into a second packet stream.

The N4 first circuits are in a one-to-one correspondence with the N4 third code streams. An intersection between the N4 first circuits and the N3 first circuits is an empty set (that is, any first circuit of the N4 first circuits is different from any first circuit of the N3 first circuits. It may be understood that N4+N3 is less than or equal to M). The second data block stream is a data block stream obtained by aggregating the N4 second data streams, and the N4 second data streams are data streams that are obtained after alignment marker removal, descrambling, and physical layer decoding are performed on the N4 third code streams; or, the second data block stream is a data block stream that is obtained after physical layer decoding is performed on the N4 second data streams, and the N4 second data streams are data streams that are obtained after alignment marker removal and descrambling are performed on the N4 third code streams; or, the second data block stream is a data block stream that is obtained after descrambling and physical layer decoding are performed on the N4 second data streams, and the N4 second data streams are data streams that are obtained after alignment marker removal is performed on the N4 third code streams; or, the second data block stream is a data block stream that is obtained after alignment marker removal, descrambling, and physical layer decoding are performed, and the N4 second data streams are the N4 third code streams.

The following further describes an example of a data aggregation application scenario.

It is assumed that a network device receives 4 first code streams with a maximum rate of 100 Gpbs (the maximum rate of each code stream is 25 Gpbs) from a first router and receives 8 third code streams with a maximum rate of 200 Gpbs (the maximum rate of each code stream is 25 Gpbs), where a maximum processing capability of a MAC and a PHY of the network device is 400 Gpbs; and it is assumed that the PHY has 16 first circuits, where a maximum processing rate of each first circuit is 25 Gpbs. Therefore, 4 first circuits of the 16 first circuits are configured to perform related processing on the 4 first code streams, and 8 first circuits of the 16 first circuits are configured to perform related processing on the third code streams. The second circuit includes a receiving circuit, and each first circuit includes an alignment marker removal circuit, a descrambling circuit, and a physical layer decoding circuit.

After receiving the 4 first code streams, the 4 first circuits perform alignment marker removal processing, descrambling processing, and physical layer decoding processing on the 4 first code streams to obtain 4 first data streams; the 4 first circuits send the 4 first data streams to the second circuit; the second circuit performs aggregation processing on the 4 first data streams to obtain a first data block stream (that is, the 4 first data streams are aggregated into a first data block stream), and sends the first data block stream to the MAC; and the MAC combines the first data block stream to obtain a first packet stream. The 4 first circuits are in a one-to-one correspondence with the 4 first code streams.

Similarly, after receiving the 8 third code streams, the 8 first circuits (certainly, the 8 first circuits are different from the foregoing 4 first circuits) perform alignment marker removal processing, descrambling processing, and physical layer decoding processing on the 8 third code streams to obtain 8 second data streams, and the 8 first circuits send the 8 second data streams to the second circuit; the second circuit performs aggregation processing on the 8 second data streams to obtain a second data block stream (that is, the 8 second data streams are aggregated into one second data block stream), and sends the second data block stream to the MAC; and the MAC combines the second data block stream into a second packet stream. The 8 first circuits are in a one-to-one correspondence with the 8 third code streams.

Because there are still 4 idle first circuits in the current PHY, the PHY may disable the 4 idle first circuits.

It can be seen from the foregoing example that based on the solution of the embodiment of the present application, the network device can simultaneously process a plurality of packet streams corresponding to different services, support interface configuration of a smaller granularity, and can present interfaces of a plurality of rates externally, which helps to implement more flexible networking, improve resource utilization, and reduce energy consumption.

It can be seen that, in the embodiments, N3 first circuits of M first circuits in a PHY receive N3 first code streams, where the N3 first circuits are in a one-to-one correspondence with the N3 first code streams; the N3 first circuits process the received N3 first code streams to obtain N3 first data streams; the N3 first circuits send the N3 first data streams to a second circuit; the second circuit processes the N3 first data streams to obtain a first data block stream. Because the PHY may selectively use the N3 first circuits of the M first circuits to receive the N3 first code streams as required, and does not need to use all the M first circuits in the PHY to receive code streams, this helps to implement that a physical layer sub-circuit with a corresponding processing capability is configured based on a size of a transmitted code stream, and diversified bandwidth modes instead of a fixed single bandwidth mode are presented externally. In this way, compared with the prior art, the technical solutions of the embodiments help to enhance flexibility of Ethernet bandwidth configuration and increase a resource reuse rate to a certain extent, to further meet a requirement for complex bandwidth configuration and extend an application scenario.

Further, because a plurality of first circuits is introduced in the embodiments, interface configuration of a smaller granularity may be supported, and the number of first circuits participating in processing may be dynamically configured as required, which helps to implement more flexible networking.

Further, because the MAC and the PHY may have different working bandwidth (for example, the bandwidth of the MAC is 400 G, while the PHY may include 40 first circuits with a 10 G bandwidth each). Compared with a technology that the MAC and the PHY have same working bandwidth, in the solutions of the embodiments, higher resource utilization is achieved, and configuration and networking become more flexible. Further, the number of working first circuits in the PHY may be configured, which helps to implement a seamless IP+optical combination with a future optical network of flexible bandwidth, and resolve a problem of possible load imbalance between different links in a case of per-flow/per-packet load sharing. By selecting a location of a circuit to be distributed, resource reuse can be maximized. In addition, a mechanism such as a hierarchical distribution and aggregation mechanism, and a pre-processing mechanism may be used to achieve a purpose of further saving resources.

For better understanding and implementation of the solutions of the embodiments of the present application, the following further provides a related apparatus configured to implement the solutions.

Referring to FIG. 5-*a* and FIG. 5-*b*, an embodiment of the present application further provides a network device 500. The network device 500 may be configured to perform the method shown in FIG. 4-*a*. The network device 500 may be a router, a network switch, a firewall, a data center, a wavelength division multiplexing device, a load balancer, or another type of network device. The network device 500 may include:

a PHY 510 and a MAC 520.

N3 first circuits 511 of M first circuits 511 in the PHY 510 are configured to receive N3 first code streams, and process the received first code streams to obtain N3 first data streams, and send the N3 first data streams to a second circuit 521. The N3 first circuits 511 are in a one-to-one correspondence with the N3 first code streams.

In an application scenario in which the second circuit 521 is located in the MAC 520, that the second circuit 521 sends a first data block stream to the MAC 520 may specifically include that: the second circuit 521 sends the first data block stream to a block combining circuit in the MAC 520. Specifically, the block combining circuit in the MAC 520 combines the first data block stream to obtain a first packet stream.

The second circuit 521 is configured to process the N3 first data streams to obtain the first data block stream.

The MAC 520 is configured to combine the first data block stream into the first packet stream.

The second circuit 521 includes a receiving circuit, the first data block stream is a data block stream obtained by aggregating the N3 first data streams, where the N3 first data streams are data streams that are obtained after alignment marker removal, descrambling, and physical layer decoding are performed on the N3 first code streams, and each first circuit 511 of the M first circuits 511 includes an alignment marker removal circuit, a descrambling circuit, and a physical layer decoding circuit.

Optionally, the second circuit 521 includes a physical layer decoding circuit; the first data block stream is a data block stream that is obtained after physical layer decoding is performed on the N3 first data streams, the N3 first data streams are data streams that are obtained after alignment marker removal and descrambling are performed on the N3 first code streams, each first circuit 511 of the M first circuits 511 includes an alignment marker removal circuit and a descrambling circuit, and the second circuit 521 is a circuit in the PHY 510.

Optionally, the second circuit 521 includes a descrambling circuit and a physical layer decoding circuit; the first data block stream is a data block stream that is obtained after descrambling and physical layer decoding are performed on the N3 first data streams, the N3 first data streams are data streams that are obtained after alignment marker removal is performed on the N3 first code streams, each first circuit 511 of the M first circuits 511 includes an alignment marker removal circuit, and the second circuit 521 is a circuit in the PHY 510.

Optionally, the second circuit 521 includes an alignment marker removal circuit, a descrambling circuit, and a physical layer decoding circuit; the second circuit 521 is a circuit in the PHY, each first circuit 511 of the M first circuits 511 includes a receiving circuit, the first data block stream is a data block stream that is obtained after alignment marker removal, descrambling, and physical layer decoding are performed, and the N3 first data streams are N3 first code streams.

For example, the N3 first code streams may be obtained in the following way:

dividing a packet stream into a data block stream; distributing the data block stream to obtain N3 sub data block streams; performing physical layer encoding on the N3 sub data block streams to obtain N3 sub data block streams that have undergone the physical layer encoding; performing scrambling on the N3 sub data block streams that have undergone the physical layer encoding to obtain N3 scrambled sub data block streams; and performing alignment marker insertion on the N3 scrambled sub data block streams to obtain N3 first code streams.

For another example, the N3 first code streams may be obtained in the following way:

dividing a packet stream into a data block stream; performing physical layer encoding on the data block stream to obtain a data block stream that has undergone the physical layer encoding; distributing the data block stream that has undergone the physical layer encoding to obtain N3 sub data block streams that have undergone the physical layer encoding; performing scrambling on the N3 sub data block streams that have undergone the physical layer encoding to obtain N3 scrambled sub data block streams; and performing alignment marker insertion on the N3 scrambled sub data block streams to obtain N3 first code streams.

For still another example, the N3 first code streams may be obtained in the following way:

dividing a packet stream into a data block stream; performing physical layer encoding on the data block stream to obtain a data block stream that has undergone the physical layer encoding; performing scrambling on the data block stream that has undergone the physical layer encoding to obtain a scrambled data block stream; dividing the scrambled data block stream into N3 sub data block streams; and performing alignment marker insertion on the N3 scrambled sub data block streams to obtain N3 first code streams.

For yet another example, the N3 first code streams may be obtained in the following way:

dividing a packet stream into a data block stream; performing physical layer encoding on the data block stream to obtain a data block stream that has undergone the physical layer encoding; performing scrambling on the data block stream that has undergone the physical layer encoding to obtain a scrambled data block stream; performing alignment marker insertion on the scrambled data block stream to obtain a code stream; and distributing the code stream to obtain N3 first code streams.

In some embodiments of the present application, the PHY 510 may be further configured to disable, in the M first circuits, at least one first circuit except the N3 first circuits.

In some embodiments of the present application, a maximum processing rate that can be provided by the N3 first circuits 511 is greater than or equal to a rate of the N3 first code streams.

Referring to FIG. 5-c and FIG. 5-d, in some embodiments of the present application, the network device 500 may further include a demultiplexing circuit 530. The demultiplexing circuit 530 is configured to receive X second code streams, perform demultiplexing processing on the X second code streams to obtain N3 first code streams, and send the N3 first code streams to the N3 first circuits 511, where X is a positive integer less than or equal to N3.

In some embodiments of the present application, N4 first circuits 511 of the M first circuits 511 are further configured to receive N4 third code streams, process the received N4 third code streams to obtain N4 second data streams, and send the N4 second data streams to the second circuit 521. The N4 first circuits 511 are in a one-to-one correspondence with the N4 third code streams. An intersection between the N4 first circuits 511 and the N3 first circuits 511 is an empty set.

The second circuit 521 is further configured to process the N4 second data streams to obtain a second data block stream, and send the second data block stream to the MAC.

The MAC 520 is further configured to combine the second data block stream into a second packet stream.

The second data block stream is a data block stream obtained by aggregating the N4 second data streams, and the N4 second data streams are data streams that are obtained after alignment marker removal, descrambling, and physical layer decoding are performed on the N4 third code streams.

Optionally, the second data block stream is a data block stream that is obtained after physical layer decoding is performed on the N4 second data streams. The N4 second data streams are data streams that are obtained after alignment marker removal and descrambling are performed on the N4 third code streams.

Optionally, the second data block stream is a data block stream that is obtained after descrambling and physical layer decoding are performed on the N4 second data streams. The N4 second data streams are data streams that are obtained after alignment marker removal is performed on the N4 third code streams.

Optionally, the second data block stream is a data block stream that is obtained after alignment marker removal, descrambling, and physical layer decoding are performed. The N4 second data streams are N4 third code streams.

It can be seen that, in the embodiments, N3 first circuits of M first circuits in a PHY of a network device 500 receive N3 first code streams, where the N3 first circuits are in a one-to-one correspondence with the N3 first code streams; the N3 first circuits process the received N3 first code streams to obtain N3 first data streams; the N3 first circuits send the N3 first data streams to a second circuit; the second circuit processes the N3 first data streams to obtain a first data block stream. Because the PHY may selectively use the N3 first circuits of the M first circuits to receive the N3 first code streams as required, and does not need to use all the M first circuits in the PHY to receive code streams, this helps to implement that a physical layer sub-circuit with a corresponding processing capability is configured based on a size of a transmitted code stream, and diversified bandwidth modes instead of a fixed single bandwidth mode are presented externally. Compared with the prior art, the technical solutions of the embodiments help to enhance flexibility of Ethernet bandwidth configuration and increase a resource reuse rate to a certain extent, to further meet a requirement for complex bandwidth configuration and extend an application scenario.

Further, because a plurality of first circuits is introduced in the embodiments, interface configuration of a smaller granularity may be supported, and the number of first circuits participating in processing may be dynamically configured as required, which helps to implement more flexible networking.

Further, because the MAC and the PHY may have different working bandwidth (for example, the bandwidth of the MAC is 400 G, while the PHY may include 40 second circuits with a 10 G bandwidth each). Compared with a technology that the MAC and the PHY have same working bandwidth, in the solutions of the embodiments, higher resource utilization is achieved, and configuration and networking become more flexible. Further, the number of working first circuits in the PHY may be configured, which helps to implement a seamless IP+optical combination with a future optical network of flexible bandwidth, and resolve a problem of possible load imbalance between different links in a case of per-flow/per-packet load sharing. By selecting a location of a circuit to be distributed, resource reuse can be maximized. In addition, a mechanism such as a hierarchical distribution and aggregation mechanism, and a pre-processing mechanism may be used to achieve a purpose of further saving resources.

It should be noted that the MAC and the PHY in each embodiment of the present application may be presented in various product forms. For example, the PHY may be integrated into a PHY chip (PHY chip), a system chip (system chip), or a multi-port Ethernet device (multi-port ethernet device). The PHY may be implemented by using an FPGA or an ASIC. The PHY may be a component in a network interface card (network interface card, NIC for short), where the NIC may be a line card (line card) or a physical interface card (physical interface card, PIC for short).

The PHY may further include a media-independent interface (MII for short, media-independent interface) for interfacing to (for interfacing to) the MAC.

In some embodiments of the present application, the PHY chip may include a plurality of PHYs. The PHY chip may be implemented by using an FPGA or an ASIC. The system chip may include a plurality of MACs and a plurality of PHYs, and the system chip may be implemented by using an FPGA or an ASIC.

In some embodiments of the present application, the multi-port Ethernet device may be an Ethernet hub, an Ethernet router, or an Ethernet switch. The multi-port Ethernet device includes a plurality of ports, where each port may include a system chip, and the system chip may include a MAC and a PHY. The multi-port Ethernet device may also integrate a plurality of MACs into one MAC chip (MAC chip), and integrate a plurality of PHYs into one PHY chip. The multi-port Ethernet device may also integrate a plurality of MACs and a plurality of PHYs into one system chip.

It may be understood that the physical layer encoding circuit mentioned in each embodiment of the present application is mainly configured to perform physical layer encoding processing on an input data stream, and the physical layer decoding circuit is mainly configured to perform physical layer decoding processing on an input data stream. The alignment marker insertion circuit is mainly configured to perform alignment marker insertion processing on input data; and the alignment marker removal circuit is mainly configured to perform alignment marker removal processing on input data. The scrambling circuit is mainly configured to perform scrambling processing on input data; and the descrambling circuit is mainly configured to perform descrambling processing on input data.

An embodiment of the present application also provides a computer storage medium, where the computer storage medium is capable of storing a program, which, when executed, includes all or a part of the steps of the method for data distribution according to the above method embodiments.

An embodiment of the present application also provides a computer storage medium, where the computer storage medium is capable of storing a program, which, when executed, includes all or a part of the steps of the method for data aggregation according to the above method embodiments.

It should be noted that, for brevity, the above method embodiments are represented as a series of actions. However, those skilled in the art should appreciate that the present application is not limited to the order of the described actions, because according to the present application, some steps may adopt other order or occur simultaneously. A person skilled in the art should also know that the embodiments described in this specification all belong to exemplary embodiments, and the involved actions and modules are not necessarily required by the present application.

In the foregoing embodiments, the description of each embodiment has its focus. For a part that is not described in detail in one embodiment, refer to related descriptions in other embodiments.

In the several embodiments provided in the present application, it should be understood that the disclosed apparatus may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments.

In addition, functional units in the embodiments of the present application may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present application essentially, or the part contributing to the prior art, or all or a part of the technical solutions may be implemented in the form of software product. The computer software product is stored in a storage medium and includes several instructions for instructing a computer device (which may be a personal computer, a server, a network device, and the like, and may be specifically a processor in the computer device) to perform all or a part of steps of the method described in the embodiments of the present application. The foregoing storage medium includes: any medium that can store program codes, such as a USB flash disk, a removable hard disk, a read-only memory (Read-Only Memory, ROM), a random access memory (Random Access Memory, RAM), a magnetic disk, or an optical disc.

It should be noted that the foregoing embodiments are merely intended for describing the technical solutions of the present application other than limiting the present application. Although the present application is described in detail with reference to the foregoing embodiments, persons of ordinary skill in the art should understand that they may still make modifications to the technical solutions described in the embodiments, or make equivalent replacements to some technical features in the technical solutions thereof, without departing from the spirit and scope of the technical solutions of the embodiments of the present application.

What is claimed is:

1. A method, comprising:
   receiving, by a first circuit comprising a physical layer encoding circuit, a first data stream;
   distributing, by the first circuit, the first data stream to a first subset of second circuits,
   wherein:
      the first subset comprises at least two of the second circuits,
      at least one other second circuit does not belong to the first subset of the second circuits and does not process the first data stream,
      each of the at least two second circuit comprises a scrambling circuit and an alignment marker insertion circuit; and
   processing, by the first subset of the second circuits, the first data stream to generate a first subset of first code streams, wherein the first subset of first code streams correspond in a one-to-one manner with the second circuits in the first subset of second circuits.

2. The method of claim 1, further comprising:
   encoding a physical layer by the physical layer encoding circuit, wherein the generated first code streams are obtained via a scrambling circuit and an alignment marker insertion circuit of the each one of the first subset of the second circuits.

3. The method according to claim 1, wherein:
   a maximum processing rate that can be provided by the first subset of the second circuits is greater than or equal to a rate of the first data block stream.

4. The method according to claim 1, further comprising:
   performing, by a multiplexing circuit, multiplexing processing on the first subset of first code streams generated via the first subset of the second circuits, the multiplexing processing performed to obtain one or more second code streams, wherein number of the one or more second code streams is less than or equal to number of the first code streams.

5. The method according to claim 1, further comprising:
   obtaining, by the first circuit, a second data stream;
   distributing, by the first circuit, the second data stream to a second subset of the second circuits, and wherein the first subset and the second subset are non-overlapping; and
   processing, by the second subset of the second circuits, the distributed second data stream to obtain third code streams, each one of the second subset of the second circuits to obtain a separate one of the third code streams.

6. The method of claim 5, wherein a second data block stream is received as the second data stream.

7. The method of claim 5, wherein the second data stream is obtained after physical layer encoding is performed on a second data block stream.

8. The method of claim 5, wherein the second data stream is obtained after physical layer encoding and scrambling are performed on a second data block stream.

9. The method of claim 5, wherein the second data stream is obtained after physical layer encoding, scrambling, and alignment marker insertion are performed on a second data block stream.

10. A method, comprising:
    receiving, by each one of a first subset of first circuits, a separate one of first code streams, wherein each of the first code stream corresponds to a separate one of the first subset of the first circuits, wherein the first subset comprises at least two of the first circuits, wherein each of the at least two first circuit comprises an alignment marker removal circuit capable of performing the alignment marker removal, and a descrambling circuit capable of performing the descrambling, wherein at least one other first circuit does not belong to the first subset of the first circuits and does not process the first data stream;
    processing, by the first subset of the first circuits, the first code streams to generate first data streams;
    processing, by a second circuit, the first data streams to obtain a first data block stream;
    generating a first packet stream according to the first data block stream; and
    wherein the second circuit comprises a physical layer decoding circuit for physical layer decoding the first data streams to obtain the first data block stream.

11. The method of claim 10, wherein the first data streams are obtained after alignment marker removal and descrambling are performed on the first code streams.

12. The method according to claim 10, wherein:
    a maximum processing rate that can be provided by the first subset of the first circuits is greater than or equal to a rate of the first code streams.

13. The method according to claim 10, the method further comprising:
    receiving, by a demultiplexing circuit, one or more second code streams;
    performing, by the demultiplexing circuit, demultiplexing processing on the one or more second code streams to obtain the first code streams wherein number of the one or more second code streams is less than or equal to number of the first code streams.

14. The method according to claim 10, wherein:
    the method further comprises: receiving, by each one of a second subset of the first circuits, a separate one of third code streams, wherein each third code streams corresponds to a separate one of the second subset of the first circuits, and wherein the first subset of the first circuits and the second subset of the first circuits are non-overlapping;

processing, by the second subset of the first circuits, the third code streams to obtain N4 second data streams;

processing, by the second circuit, the second data streams to obtain a second data block stream; and combining the second data block stream into a second packet stream.

15. The method of claim 14, wherein the second data block stream is obtained by aggregating the second data streams, and wherein the second data streams are obtained after alignment marker removal, descrambling, and physical layer decoding are performed on the third code streams.

16. The method of claim 14, wherein the second data block stream is obtained after physical layer decoding is performed on the second data streams, and wherein the second data streams are obtained after alignment marker removal and descrambling are performed on the third code streams.

17. The method of claim 14, wherein the second data block stream is obtained after descrambling and physical layer decoding are performed on the second data streams, and wherein the second data streams are obtained after alignment marker removal is performed on the third code streams.

18. The method of claim 14, wherein the second data block stream is obtained after alignment marker removal, descrambling, and physical layer decoding are performed on the second data stream, and wherein the third code streams are received as the second data stream.

19. A network device, comprising:

a first circuit and a second circuit, wherein a first circuit is configured to obtain a first data stream, and distribute the first data stream to N1 second circuits of M second circuits, wherein the M is greater than the N1, the N1 is a positive integer and the N1 is equal to or greater than 2, and the M is a positive integer, at least one other second circuit in the M second circuits but does not belong to the N1 second circuits and does not process the first data stream, and wherein the N1 second circuits are configured to process the distributed first data stream to generate N1 first code streams, wherein the N1 second circuits are in a one-to-one correspondence with the N1 first code streams, wherein the first circuit comprises a physical layer encoding circuit, wherein each of the N1 second circuit comprises a scrambling circuit and an alignment marker insertion circuit.

20. The network device of claim 19, wherein:

a maximum processing rate that can be provided by the N1 second circuits is greater than or equal to a rate of the first data block stream.

21. The network device of claim 19, wherein the network device further comprises a multiplexing circuit, the multiplexing circuit is configured to perform multiplexing processing on the N1 first code streams to obtain X second code streams, and the X is a positive integer less than or equal to the N1.

22. The network device of claim 19, wherein, wherein the first circuit is further configured to obtain a second data stream, and distribute the second data stream to N2 second circuits of the M second circuits, wherein the M is greater than the N2, N2 being a positive integer, wherein a collection of the N2 second circuits and a collection of the N1 second circuits are non-overlapping, wherein the N2 second circuits are further configured to process the distributed second data stream to obtain N2 third code streams, wherein the N2 second circuits are in a one-to-one correspondence with the N2 third code streams, and the second data stream is the second data block stream or a data stream obtained from processing operations performed on the second data block stream.

23. The network device of claim 22, wherein the processing operations comprise physical layer encoding.

24. The network device of claim 23, wherein the processing operations further comprise scrambling.

25. The network device of claim 24, wherein the processing operations further comprise alignment marker insertion.

26. A network device, comprising M first circuits, a second circuit and a third circuit, wherein N3 first circuits of the M first circuits are configured to receive N3 first code streams, and process the received first code streams to obtain N3 first data streams, wherein the N3 first circuits are in a one-to-one correspondence with the N3 first code streams, wherein the M is greater than the N3, the N3 is a positive integer and the N3 is equal to or greater than 2, wherein each of the N3 first circuits comprises an alignment marker removal circuit capable of performing the alignment removal, and a descrambling circuit capable of performing the descrambling, and wherein the second circuit comprises a physical layer decoding circuit for physical layer decoding the first data streams to obtain the first data block stream wherein at least one other first circuit in the M first circuits but does not belong to the N3 first circuits and does not process the first data stream;

wherein the second circuit is configured to process the N3 first data streams to obtain a first data block stream, wherein the third circuit is configured to combine the first data block stream to obtain a first packet stream.

27. The network device of claim 26, wherein a maximum processing rate that can be provided by the N3 first circuits is greater than or equal to a rate of the N3 first code streams.

28. The network device of claim 26, wherein:

the network device further comprises a demultiplexing circuit, wherein the demultiplexing circuit is configured to receive X second code streams, perform demultiplexing processing on the X second code streams to obtain the N3 first code streams, wherein the X is a positive integer less than or equal to the N3.

29. The network device of claim 26, wherein

N4 first circuits of the M first circuits are further configured to receive N4 third code streams, and process the received N4 third code streams to obtain N4 second data streams, wherein the N4 first circuits are in a one-to-one correspondence with the N4 third code streams, wherein a collection of the N4 first circuits and a collection of the N3 first circuits are non-overlapping, wherein the second circuit is further configured to process the N4 second data streams to obtain a second data block stream, wherein the MAC is further configured to combine the second data block stream into a second packet stream.

30. The network device of claim 29, wherein the second data block stream is obtained by aggregating the N4 second data streams, and the N4 second data streams are obtained after alignment marker removal, descrambling, and physical layer decoding are performed on the N4 third code streams.

31. The network device of claim 29, wherein the second data block stream is obtained after physical layer decoding is performed on the N4 second data streams, and the N4 second data streams are obtained after alignment marker removal and descrambling are performed on the N4 third code streams.

32. The network device of claim 29, wherein the second data block stream is obtained after descrambling and physical layer decoding are performed on the N4 second data streams, and the N4 second data streams are obtained after alignment marker removal is performed on the N4 third code streams.

33. The network device of claim 29, wherein the second data block stream is obtained after alignment marker removal, descrambling, and physical layer decoding are performed on the N4 second data streams, and the N4 third code streams are received as the N4 second data streams.

* * * * *